United States Patent
Liu et al.

(10) Patent No.: US 9,627,403 B2
(45) Date of Patent: Apr. 18, 2017

(54) MULTILEVEL MEMORY STACK STRUCTURE EMPLOYING SUPPORT PILLAR STRUCTURES

(71) Applicant: SANDISK TECHNOLOGIES INC., Plano, TX (US)

(72) Inventors: Jin Liu, Milpitas, CA (US); Tong Zhang, Palo Alto, CA (US); Jayavel Pachamuthu, San Jose, CA (US); Yao-Sheng Lee, Tampa, FL (US); Johann Alsmeier, San Jose, CA (US)

(73) Assignee: SANDISK TECHNOLOGIES LLC, Plano, TX (US)

( * ) Notice: Subject to any disclaimer, the term of this patent is extended or adjusted under 35 U.S.C. 154(b) by 0 days.

(21) Appl. No.: 14/862,916

(22) Filed: Sep. 23, 2015

(65) Prior Publication Data

US 2016/0322381 A1 Nov. 3, 2016

Related U.S. Application Data

(60) Provisional application No. 62/154,916, filed on Apr. 30, 2015.

(51) Int. Cl.
*H01L 27/115* (2006.01)
*H01L 21/28* (2006.01)
(Continued)

(52) U.S. Cl.
CPC .. *H01L 27/11582* (2013.01); *H01L 21/28273* (2013.01); *H01L 21/28282* (2013.01);
(Continued)

(58) Field of Classification Search
None
See application file for complete search history.

(56) References Cited

U.S. PATENT DOCUMENTS

| 5,387,530 A | 2/1995 | Doyle et al. |
| 5,915,167 A | 6/1999 | Leedy |

(Continued)

FOREIGN PATENT DOCUMENTS

| EP | 1398831 A2 | 3/2004 |
| WO | WO02/15277 A2 | 2/2002 |

(Continued)

OTHER PUBLICATIONS

Jang et al., "Vertical Cell Array Using TCAT (Terabit Cell Array Transistor) Technology for Ultra High Density NAND Flash Memory," 2009 Symposium on VLSI Technology Digest of Technical Papers, pp. 192-193.

(Continued)

*Primary Examiner* — Khaja Ahmad
(74) *Attorney, Agent, or Firm* — The Marbury Law Group PLLC

(57) ABSTRACT

A first stack of alternating layers including first electrically insulating layers and first sacrificial material layers is formed with first stepped surfaces. First memory openings can be formed in a device region outside of the first stepped surfaces, and first support openings can be formed through the first stepped surfaces. The first memory openings and the first support openings can be filled with a sacrificial fill material. A second stack of alternating layers including second electrically insulating layers and second sacrificial material layers can be formed over the first stack. Inter-stack memory openings including the first memory openings can be formed in the device region, and inter-stack support openings including the first support openings can be formed in a steppes surface region. Memory stack structures and support pillar structure are simultaneously formed in the inter-stack memory openings and the inter-stack support openings, respectively.

25 Claims, 19 Drawing Sheets

(51) Int. Cl.
  *H01L 21/768* (2006.01)
  *H01L 23/528* (2006.01)
  *H01L 29/417* (2006.01)
  *H01L 29/788* (2006.01)
  *H01L 27/11582* (2017.01)
  *H01L 27/1157* (2017.01)
  *H01L 27/11575* (2017.01)
  *H01L 27/11526* (2017.01)
  *H01L 27/11556* (2017.01)
  *H01L 27/11573* (2017.01)

(52) U.S. Cl.
  CPC .. *H01L 21/76802* (2013.01); *H01L 21/76877* (2013.01); *H01L 23/528* (2013.01); *H01L 27/1157* (2013.01); *H01L 27/11526* (2013.01); *H01L 27/11556* (2013.01); *H01L 27/11573* (2013.01); *H01L 27/11575* (2013.01); *H01L 29/41741* (2013.01); *H01L 29/7883* (2013.01)

(56) References Cited

U.S. PATENT DOCUMENTS

| | | |
|---|---|---|
| 7,177,191 B2 | 2/2007 | Fasoli et al. |
| 7,221,588 B2 | 5/2007 | Fasoli et al. |
| 7,233,522 B2 | 6/2007 | Chen et al. |
| 7,514,321 B2 | 4/2009 | Mokhlesi et al. |
| 7,575,973 B2 | 8/2009 | Mokhlesi et al. |
| 7,745,265 B2 | 6/2010 | Mokhlesi et al. |
| 7,808,038 B2 | 10/2010 | Mokhlesi et al. |
| 7,848,145 B2 | 12/2010 | Mokhlesi et al. |
| 7,851,851 B2 | 12/2010 | Mokhlesi et al. |
| 8,008,710 B2 | 8/2011 | Fukuzumi |
| 8,053,829 B2 | 11/2011 | Kang et al. |
| 8,187,936 B2 | 5/2012 | Alsmeier et al. |
| 8,193,054 B2 | 6/2012 | Alsmeier |
| 8,198,672 B2 | 6/2012 | Alsmeier |
| 8,349,681 B2 | 1/2013 | Alsmeier et al. |
| 8,394,716 B2 | 3/2013 | Hwang et al. |
| 8,445,347 B2 | 5/2013 | Alsmeier |
| 8,450,181 B2 | 5/2013 | Chen et al. |
| 8,614,126 B1 | 12/2013 | Lee et al. |
| 8,658,499 B2 | 2/2014 | Makala et al. |
| 8,741,761 B2 | 6/2014 | Lee et al. |
| 8,828,884 B2 | 9/2014 | Lee et al. |
| 8,847,302 B2 | 9/2014 | Alsmeier et al. |
| 8,878,278 B2 | 11/2014 | Alsmeier et al. |
| 8,884,357 B2 | 11/2014 | Wang et al. |
| 8,928,061 B2 | 1/2015 | Chien et al. |
| 8,946,023 B2 | 2/2015 | Makala et al. |
| 9,023,719 B2 | 5/2015 | Pachamuthu et al. |
| 9,230,979 B1 | 1/2016 | Pachamuthu et al. |
| 9,437,606 B2 | 9/2016 | Makala et al. |
| 2006/0003531 A1 | 1/2006 | Chang et al. |
| 2006/0258076 A1 | 11/2006 | Mizushima et al. |
| 2007/0210338 A1 | 9/2007 | Orlowski |
| 2007/0252201 A1 | 11/2007 | Kito et al. |
| 2008/0067583 A1 | 3/2008 | Kidoh et al. |
| 2008/0169496 A1 | 7/2008 | Keller et al. |
| 2009/0026561 A1 | 1/2009 | Reichenbach et al. |
| 2009/0121271 A1 | 5/2009 | Son et al. |
| 2009/0242967 A1 | 10/2009 | Katsumata et al. |
| 2010/0044778 A1 | 2/2010 | Seol |
| 2010/0059811 A1 | 3/2010 | Sekine et al. |
| 2010/0112769 A1 | 5/2010 | Son et al. |
| 2010/0120214 A1 | 5/2010 | Park et al. |
| 2010/0133599 A1 | 6/2010 | Chae et al. |
| 2010/0155810 A1 | 6/2010 | Kim et al. |
| 2010/0155818 A1 | 6/2010 | Cho |
| 2010/0171162 A1 | 7/2010 | Katsumata et al. |
| 2010/0181610 A1 | 7/2010 | Kim et al. |
| 2010/0207195 A1 | 8/2010 | Fukuzumi et al. |
| 2010/0213458 A1 | 8/2010 | Prall |
| 2010/0320528 A1 | 12/2010 | Jeong et al. |
| 2011/0065270 A1* | 3/2011 | Shim .............. H01L 27/11556 438/589 |
| 2011/0076819 A1 | 3/2011 | Kim et al. |
| 2011/0133606 A1 | 6/2011 | Yoshida et al. |
| 2011/0151667 A1 | 6/2011 | Hwang et al. |
| 2011/0266606 A1 | 11/2011 | Park et al. |
| 2011/0287612 A1 | 11/2011 | Lee et al. |
| 2011/0312174 A1* | 12/2011 | Lee ............... H01L 27/11582 438/595 |
| 2012/0001247 A1 | 1/2012 | Alsmeier |
| 2012/0001249 A1 | 1/2012 | Alsmeier et al. |
| 2012/0003800 A1 | 1/2012 | Lee et al. |
| 2012/0003831 A1* | 1/2012 | Kang ............... H01L 27/11551 438/639 |
| 2012/0052674 A1 | 3/2012 | Lee et al. |
| 2012/0061744 A1* | 3/2012 | Hwang ............ H01L 27/11565 257/324 |
| 2012/0068242 A1 | 3/2012 | Shin et al. |
| 2012/0074367 A1 | 3/2012 | Costa et al. |
| 2012/0119287 A1* | 5/2012 | Park ................ H01L 27/11519 257/329 |
| 2012/0140562 A1 | 6/2012 | Choe et al. |
| 2012/0153376 A1 | 6/2012 | Alsmeier et al. |
| 2012/0208347 A1 | 8/2012 | Hwang et al. |
| 2012/0256247 A1 | 10/2012 | Alsmeier et al. |
| 2012/0261638 A1 | 10/2012 | Sills et al. |
| 2012/0261722 A1 | 10/2012 | Tang et al. |
| 2012/0276719 A1 | 11/2012 | Han et al. |
| 2013/0248974 A1 | 9/2013 | Alsmeier et al. |
| 2013/0264631 A1 | 10/2013 | Alsmeier et al. |
| 2013/0313627 A1 | 11/2013 | Lee et al. |
| 2013/0313717 A1 | 11/2013 | Holmes et al. |
| 2013/0322174 A1 | 12/2013 | Li et al. |
| 2014/0225181 A1 | 8/2014 | Makala et al. |
| 2014/0264525 A1 | 9/2014 | Takahashi et al. |
| 2014/0264533 A1 | 9/2014 | Simsek-Ege et al. |
| 2014/0264542 A1 | 9/2014 | Simsek-Ege et al. |
| 2014/0273373 A1 | 9/2014 | Makala et al. |
| 2015/0076580 A1 | 3/2015 | Pachamuthu et al. |
| 2015/0179660 A1 | 6/2015 | Yada et al. |
| 2015/0348984 A1 | 12/2015 | Yada et al. |
| 2016/0049423 A1* | 2/2016 | Yoo ................ H01L 27/11582 257/324 |
| 2016/0163728 A1 | 6/2016 | Tsutsumi et al. |
| 2016/0276359 A1 | 9/2016 | Oginoe et al. |

FOREIGN PATENT DOCUMENTS

| | | |
|---|---|---|
| WO | WO2008/118433 A1 | 10/2008 |
| WO | WO2009/085078 A1 | 7/2009 |
| WO | WO2012/003301 A2 | 1/2012 |
| WO | WO2015/126664 A1 | 8/2015 |

OTHER PUBLICATIONS

Katsumata et al., "Pipe-Shaped BiCS Flash Memory with 16 Stacked Layers and Multi-Level-Cell Operation for Ultra High Density Storage Devices," 2009 Symposium on VLSI Technology Digest of Technical Papers, pp. 136-137.

Maeda et al., "Multi-Stacked 1G Cell/Layer Pipe-Shaped BiCS Flash Memory," 2009 Symposium on VLSI Technology Digest of Technical Papers, pp. 22-23.

Endoh et al., "Novel Ultra High Density Memory with a Stacked-Surrounding Gate Transistor (S-SGT) Structured Cell," IEDM Proc. (2001) 33-36.

Tanaka et al., "Bit-Cost Scalable Technology for Low-Cost and Ultrahigh-Density Flash Memory," Toshiba Review, vol. 63, No. 2, 2008, pp. 28-31.

Kimura, M. "3D Cells Make Terabit NAND Flash Possible," Nikkei Electronics Asia, Sep. 17, 2009, 6pgs.

International Search Report & Written Opinion, PCT/US2011/042566, Jan. 17, 2012.

Invitation to Pay Additional Fees & Partial International Search Report, PCT/US2011/042566, Sep. 28, 2011.

Jang et al., "Memory Properties of Nickel Silicide Nanocrystal Layer for Possible Application to Nonvolatile Memory Devices," IEEE Transactions on Electron Devices, vol. 56, No. 12, Dec. 2009.

(56) References Cited

OTHER PUBLICATIONS

Chen et al., "Reliability Characteristics of NiSi Nanocrystals Embedded in Oxide and Nitride Layers for Nonvolatile Memory Application," Applied Physics Letters 92, 152114 (2008).
J. Ooshita, Toshiba Announces 32Gb 3D-Stacked Multi-Level NAND Flash, 3 pages, http://techon.nikkeibp.co.jp/english/NEWS_EN/20090619/171977/ Nikkei Microdevices, Tech-On, Jun. 19, 2009.
Li, W. et al., "Sacrificial Polymers for Nanofluidic Channels in Biological Applications", Nanotechnology 14 (2003) 578-583.
Invitation to Pay Additional Search Fees, International Application No. PCT/US13/24638, issued Apr. 24, 2013.
Non-Final Office for U.S. Appl. No. 13/933,743, Office Action issued Apr. 21, 2014, 29pgs.
Search Report and Written Opinion PCT/US2014/020290, dated Jun. 25, 2014, 10 pages.
Search Report and Written Opinion of PCT/US2014/023276, dated Jun. 30, 2014, 13 pages.
Invitation to Pay Additional Fees and Annex Partial International Search Report for PCT/US2015/015155, dated May 25, 2015, 8 Sheets.
Office Action issued on Apr. 21, 2014, for U.S. Appl. No. 13/933,743, (29 pages).
U.S. Appl. No. 14/133,979, filed Dec. 19, 2013, SanDisk Technologies Inc.
U.S. Appl. No. 14/225,116, filed Mar. 25, 2014, SanDisk Technologies Inc.
U.S. Appl. No. 14/225,176, filed Mar. 25, 2014, SanDisk Technologies Inc.
U.S. Appl. No. 14/317,274, filed Jun. 27, 2014, SanDisk Technologies Inc.
U.S. Appl. No. 14/517,134, filed Oct. 17, 2014, SanDisk Technologies Inc.
U.S. Appl. No. 14/519,733, filed Oct. 21, 2014, SanDisk Technologies Inc.
U.S. Appl. No. 14/600,226, filed Jan. 20, 2015, SanDisk Technologies Inc.
U.S. Appl. No. 14/611,785, filed Feb. 2, 2015, SanDisk Technologies Inc.
U.S. Appl. No. 14/748,808, filed Jun. 24, 2015, SanDisk Technologies Inc.
U.S. Appl. No. 14/834,830, filed Aug. 25, 2015, SanDisk Technologies Inc.
U.S. Appl. No. 14/834,943, filed Aug. 25, 2015, SanDisk Technologies Inc.
U.S. Appl. No. 62/154,916, filed Apr. 30, 2015, SanDisk Technologies Inc.
Notification of Transmittal of the International Search Report and the Written Opinion of the International Searching Authority, International Search Report for PCT/US2016/025409, dated Aug. 10, 2016, 16 pages.
Ohsaki, S. et al., "Three-Dimensional Memory Device With Aluminum-Containing Etch Stop Layer for Backside Contact Structure and Method of Making Thereof," U.S. Appl. No. 15/159,034, filed May 19, 2016, 132 pages.
Invitation to Pay Additional Fees and Communication Relating to the Results of the Partial International Search for PCT/US2016/025409, dated Jun. 13, 2016, 7 pages.

\* cited by examiner

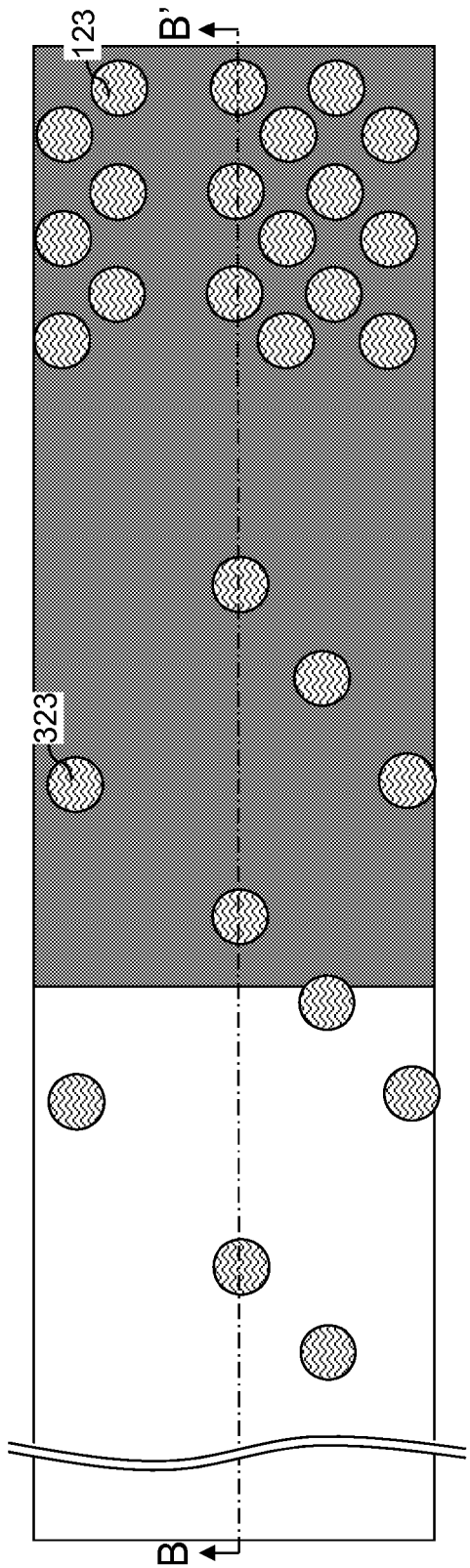
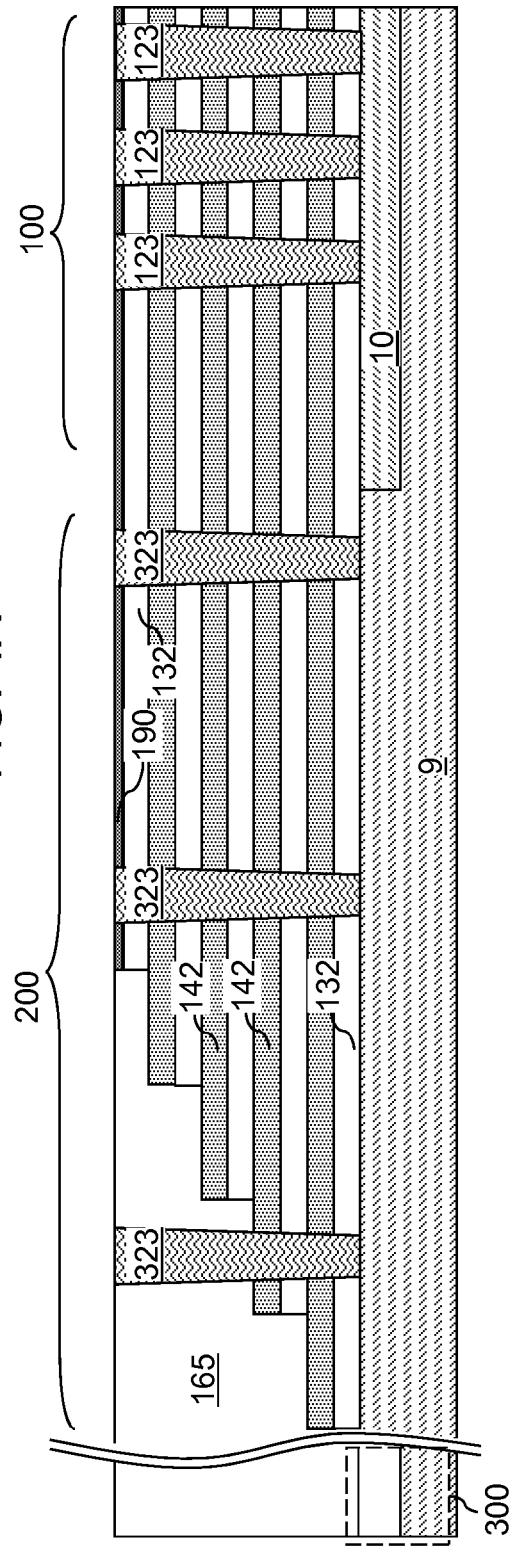
FIG. 4A
FIG. 4B

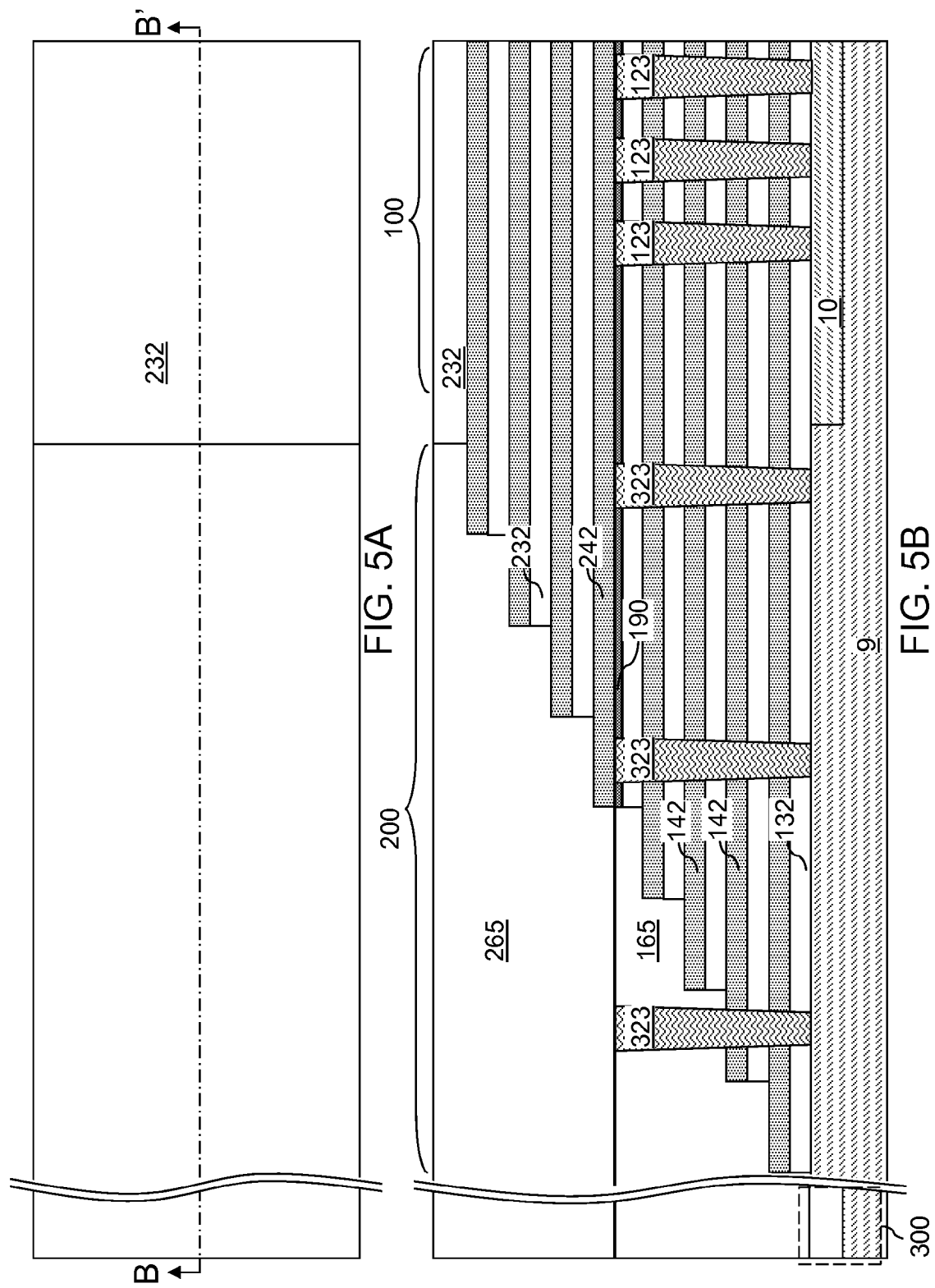

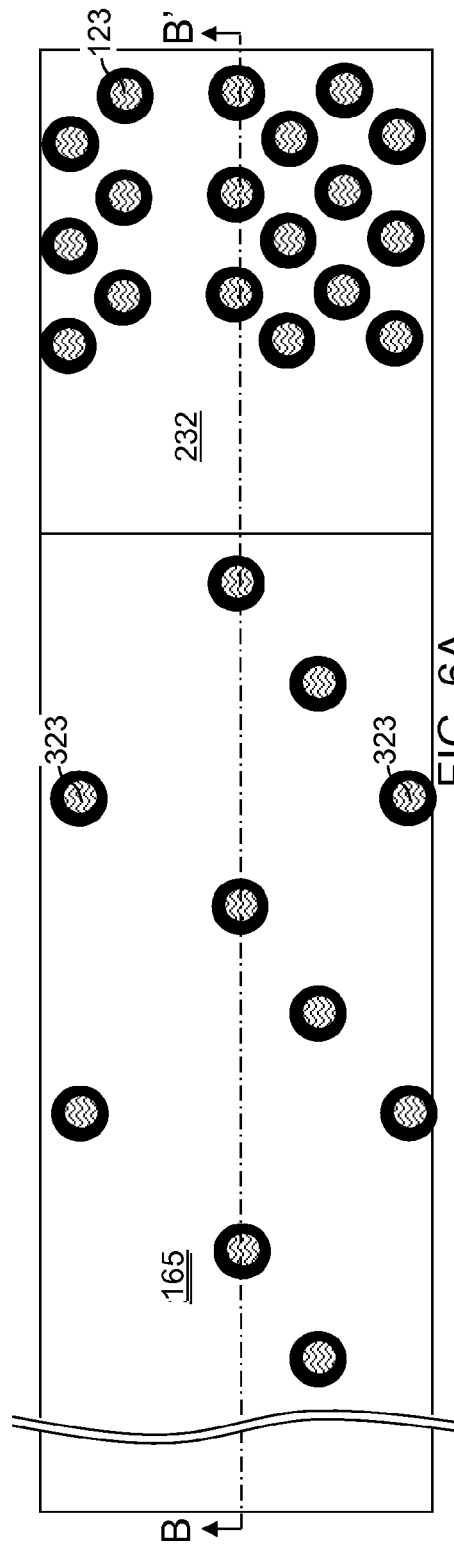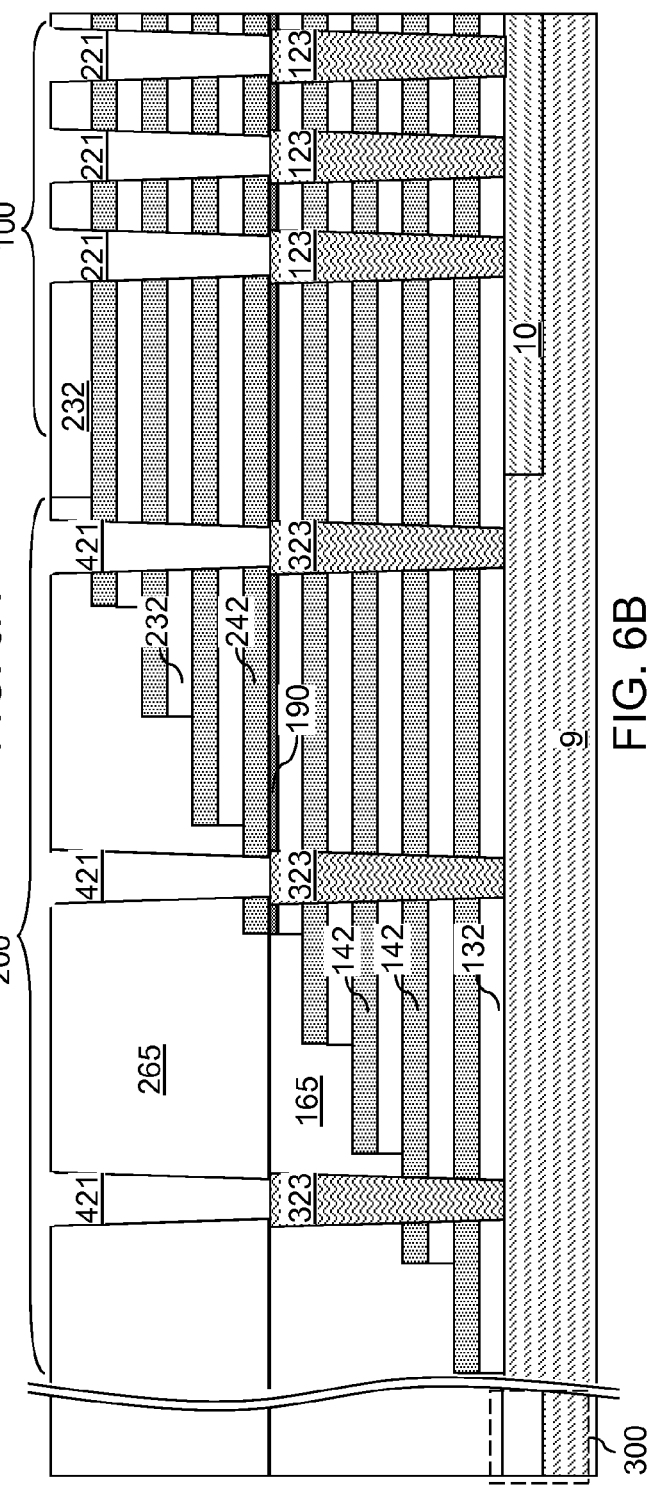

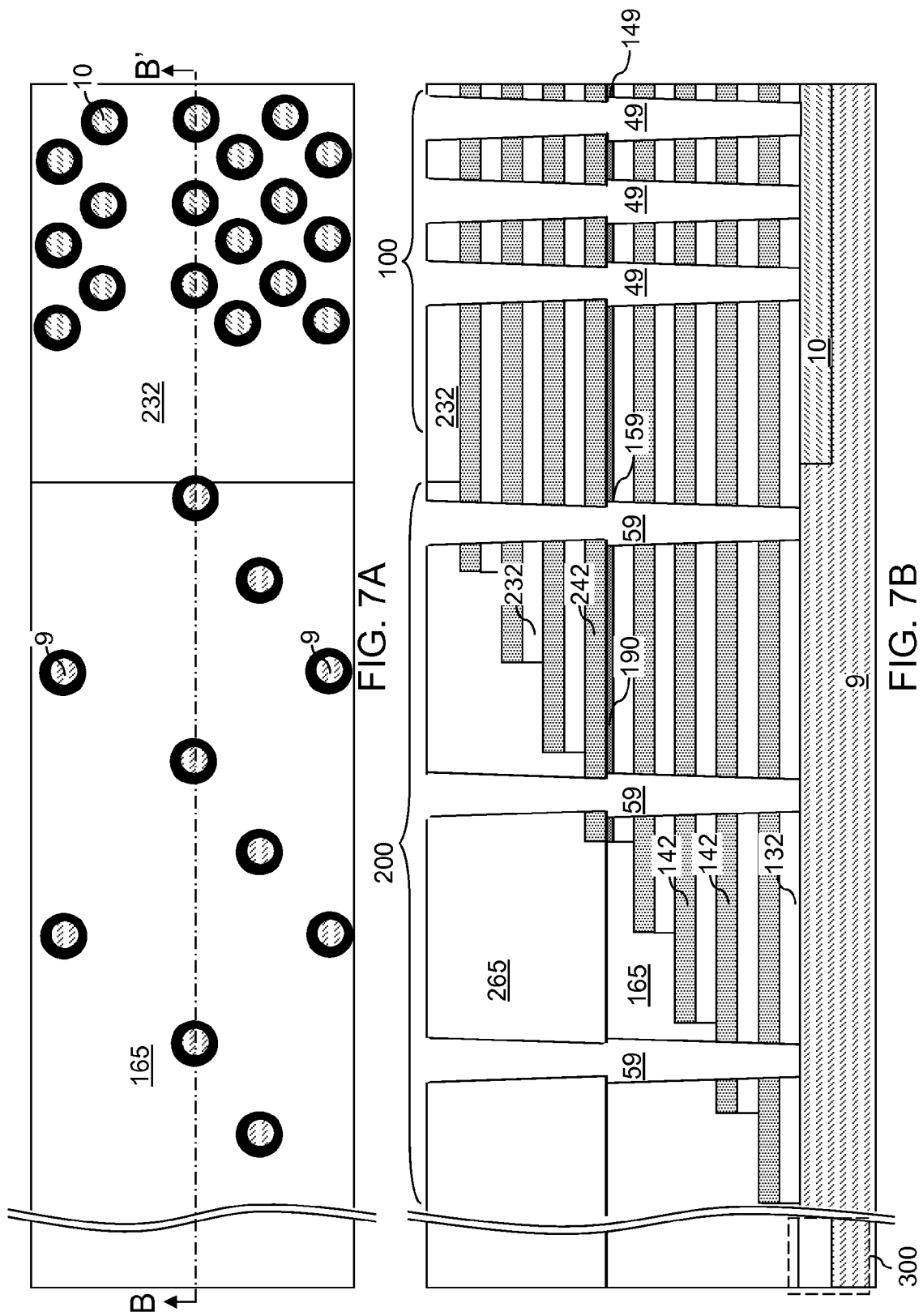

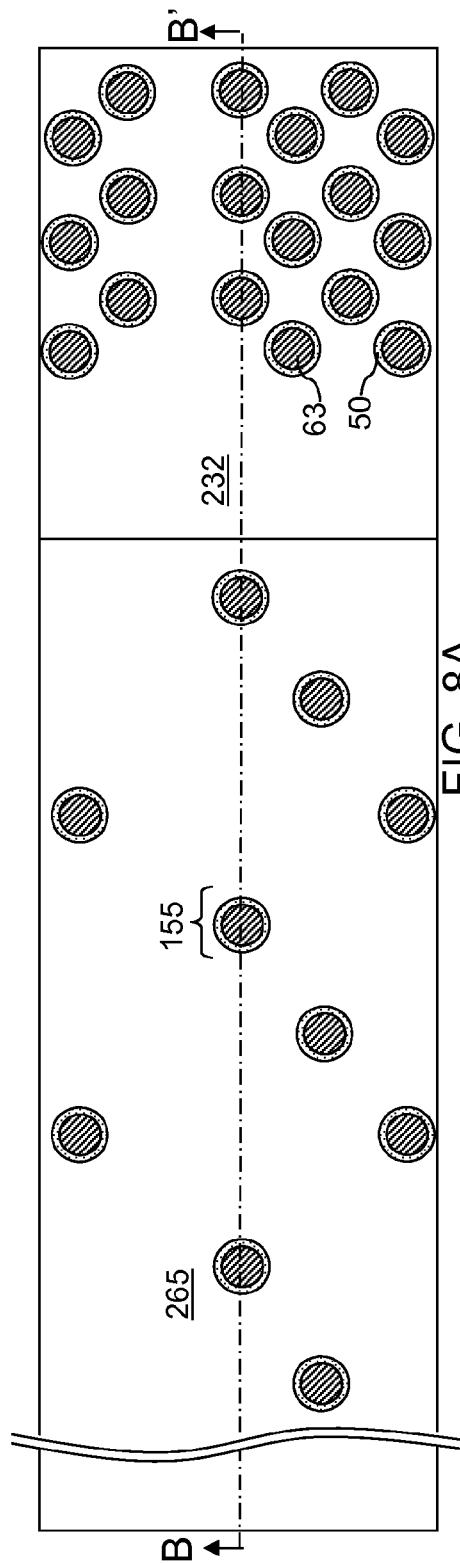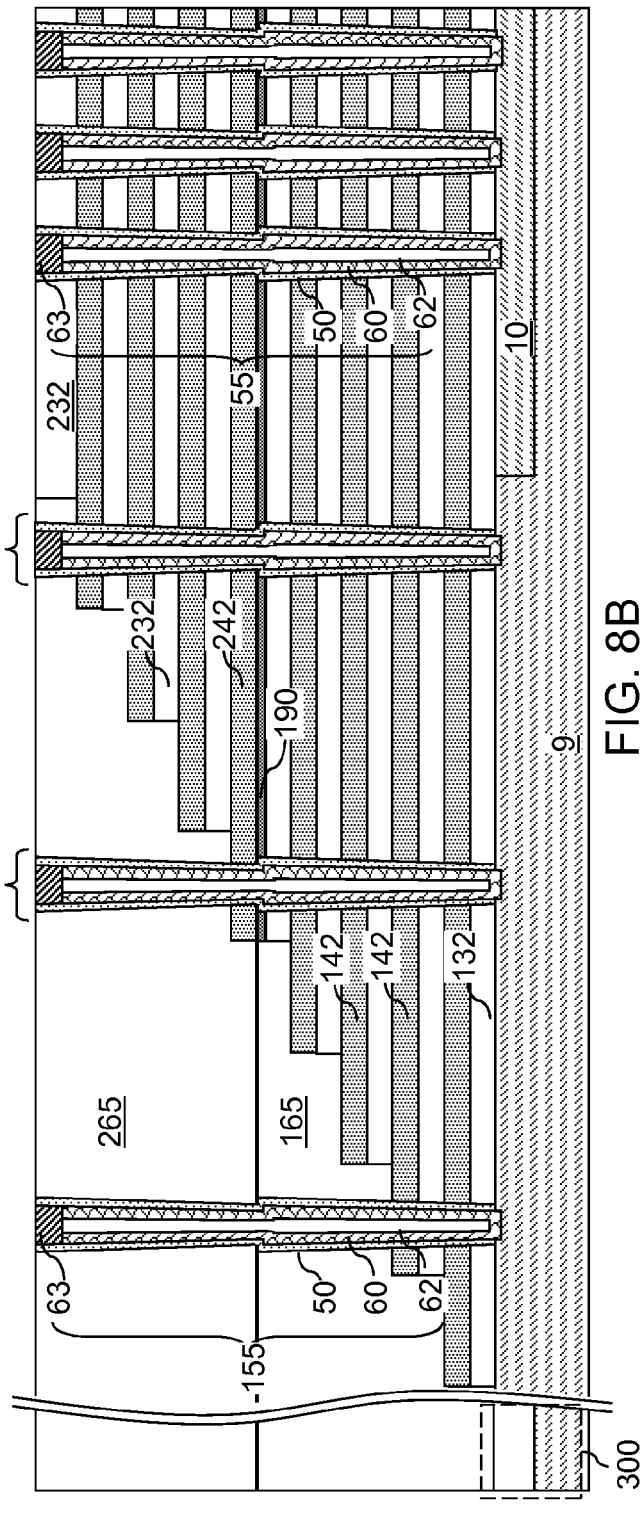

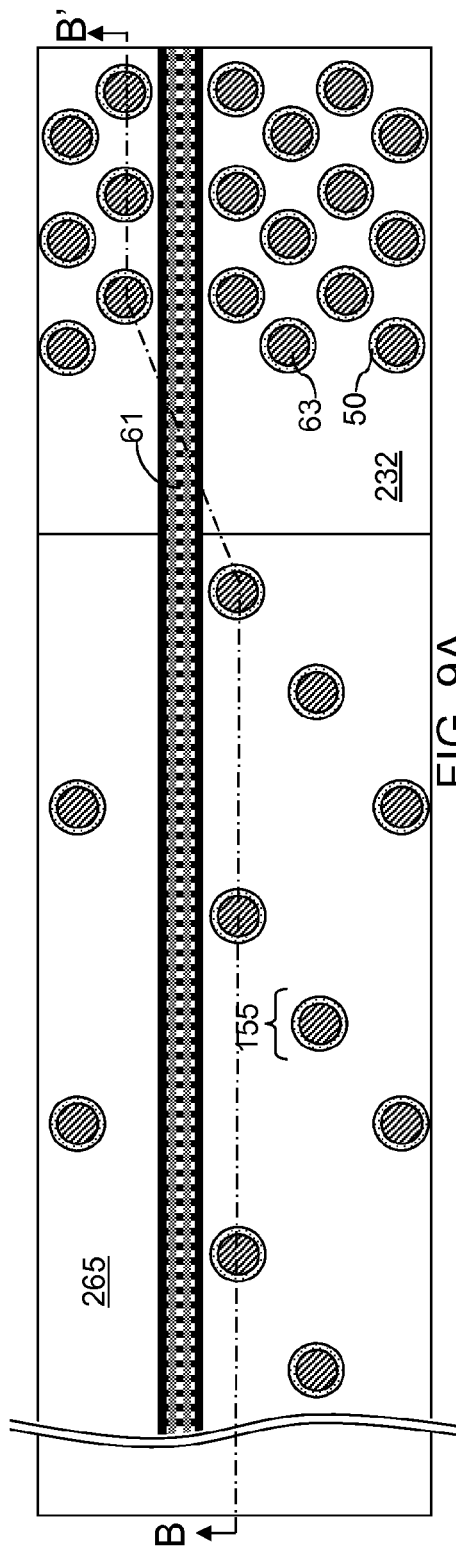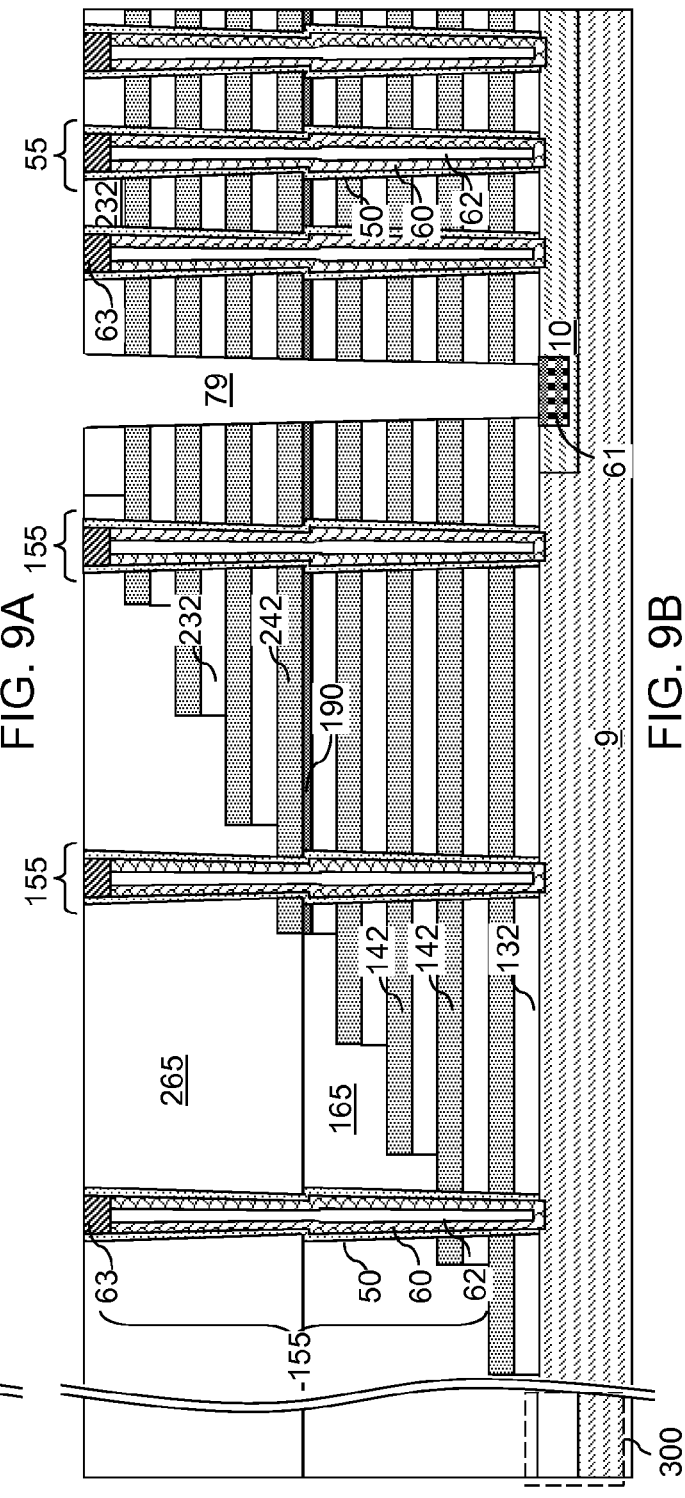

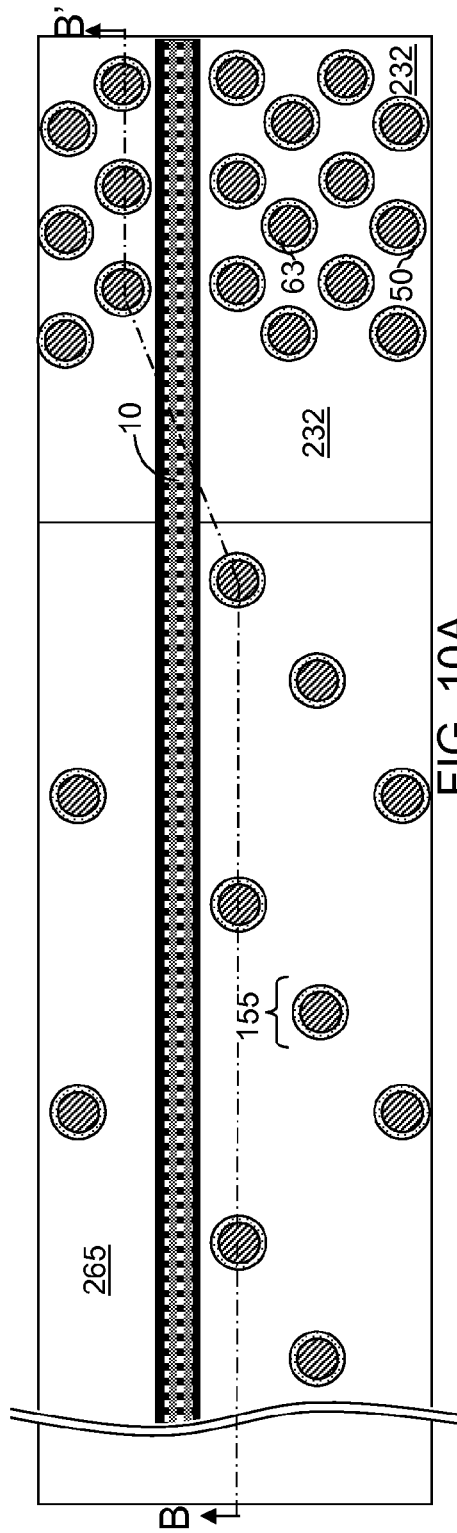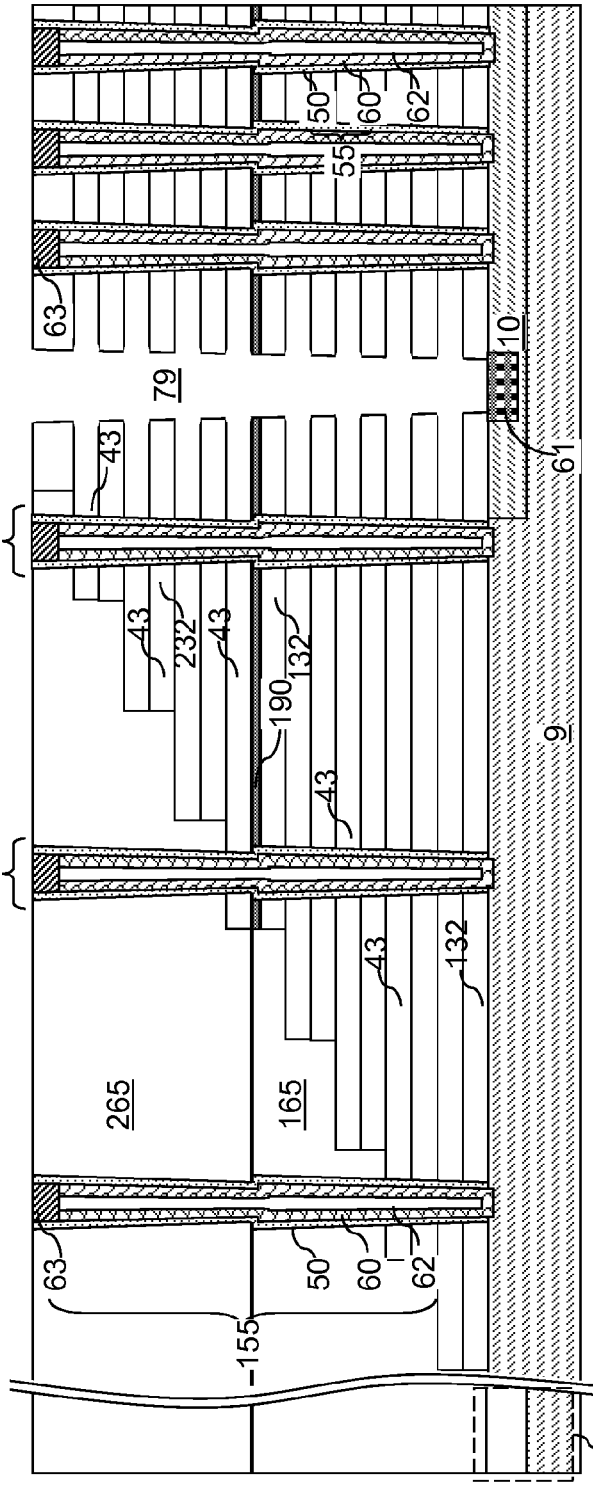

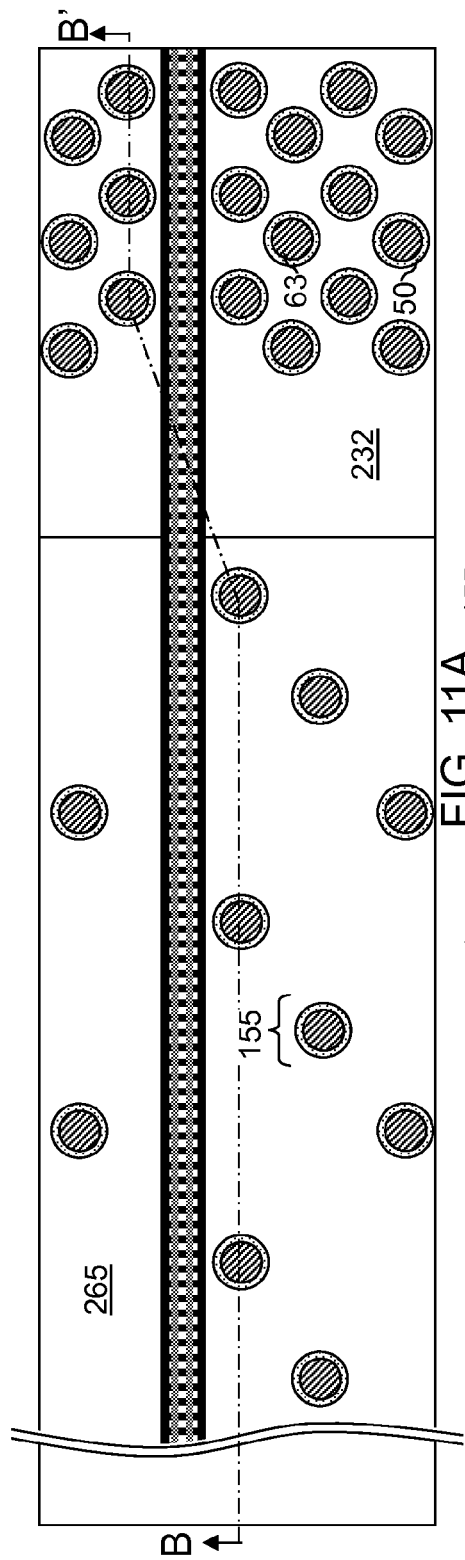
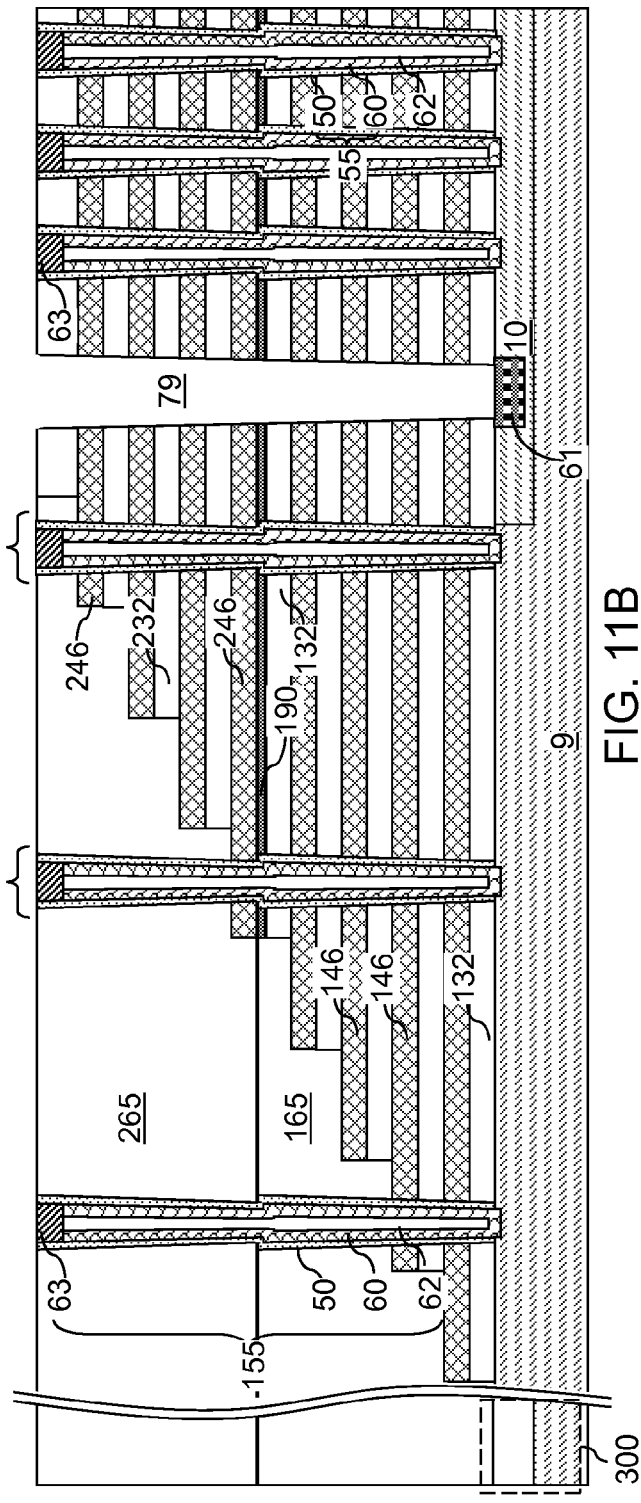
FIG. 11A
FIG. 11B

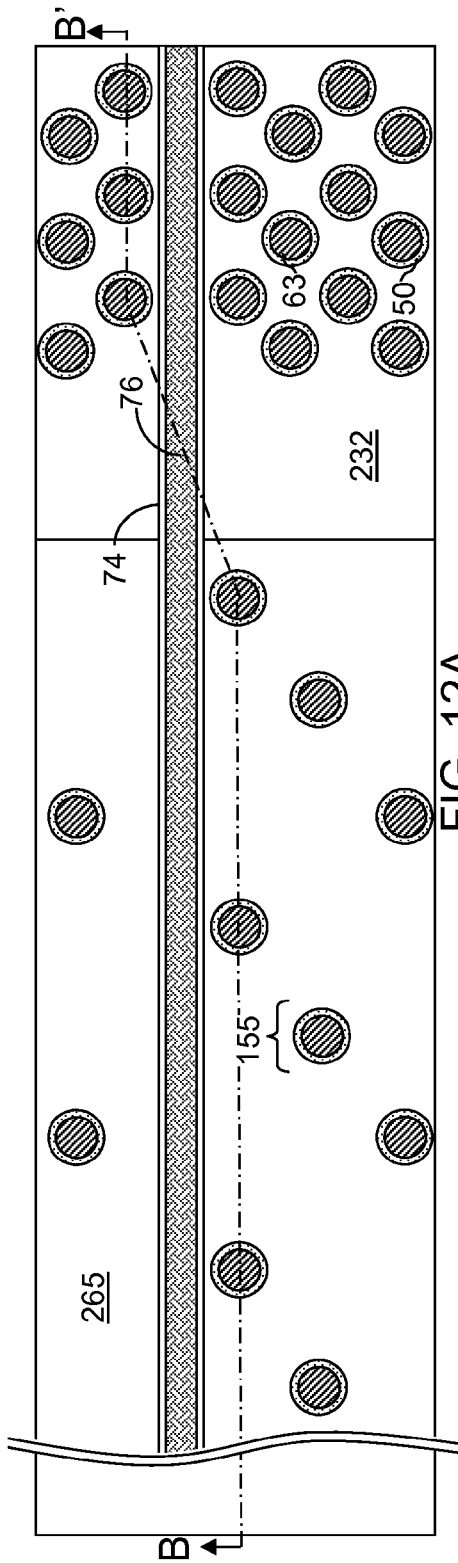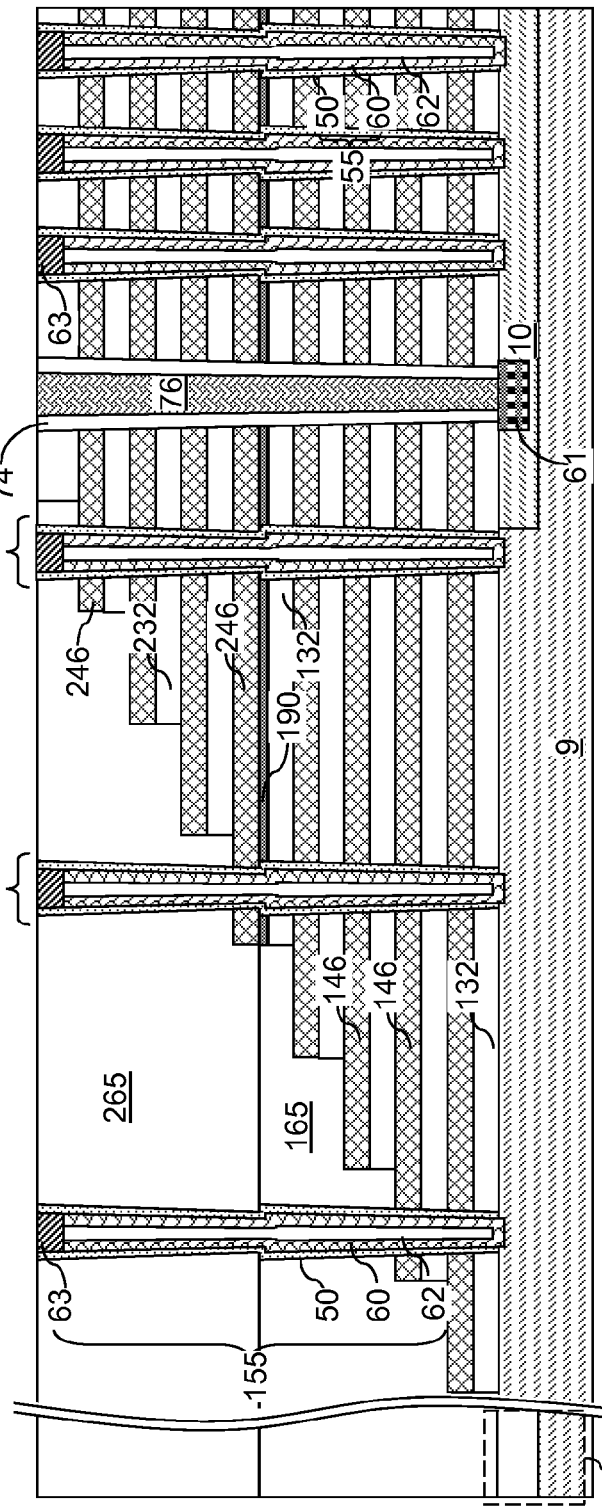
FIG. 12A
FIG. 12B

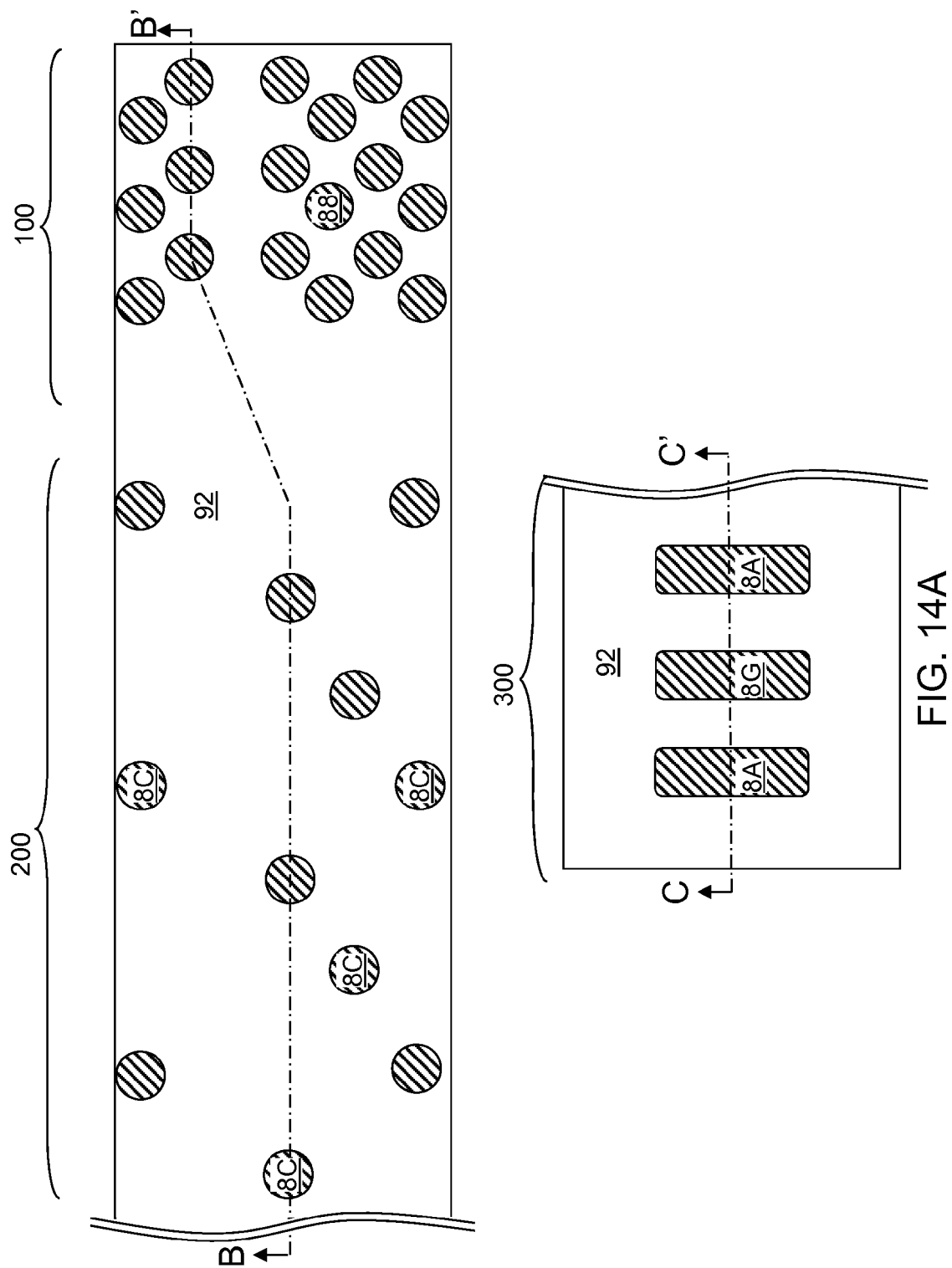

MULTILEVEL MEMORY STACK STRUCTURE EMPLOYING SUPPORT PILLAR STRUCTURES

FIELD

The present invention relates generally to the field of three-dimensional memory devices and specifically to three-dimensional memory devices including a vertical stack of multilevel memory arrays and methods of making the same.

BACKGROUND

Three-dimensional vertical NAND strings having one bit per cell are disclosed in an article by T. Endoh, et. al., titled "Novel Ultra High Density Memory With A Stacked-Surrounding Gate Transistor (S-SGT) Structured Cell", IEDM Proc. (2001) 33-36.

SUMMARY

According to an aspect of the present disclosure, a monolithic three-dimensional memory device is provided, which comprises a lower stack structure comprising a first stack of alternating layers including first electrically insulating layers and first electrically conductive layers and located over a substrate; an upper stack structure comprising a second stack of alternating layers including second electrically insulating layers and second electrically conductive layers and located over the lower stack structure; a plurality of memory stack structures including respective vertical semiconductor channels, wherein a bottommost portion of each vertical semiconductor channel is electrically shorted to a source region located below the lower stack, and an upper portion of each vertical semiconductor channel is electrically shorted to a drain contact via structure overlying the vertical semiconductor channel; and at least one support pillar structure located within a stepped surface region of the lower and upper stack structures, comprising a same set of materials as the plurality of memory stack structures, wherein an entire top surface of each of the at least one support pillar structure is in physical contact with a bottom surface of a dielectric material layer that overlies the at least one support pillar structure.

According to another aspect of the present disclosure, a method of forming a three-dimensional memory device is provided. The method includes forming a lower stack structure over a substrate, where the lower stack structure comprises a first stack of alternating layers including first electrically insulating layers and first sacrificial material layers, forming first memory openings through the lower stack structure and filling the first memory openings with a sacrificial fill material, and forming an upper stack structure over the lower stack structure, wherein the upper stack structure comprises a second stack of alternating layers including second electrically insulating layers and second sacrificial material layers. The method also includes forming second memory openings through the upper stack structure in areas overlying the first memory openings, removing the sacrificial fill material from the first memory openings underneath the second memory openings to form inter-stack memory openings, forming memory stack structures within the inter-stack memory openings, simultaneously removing the first sacrificial material layers and the second sacrificial material layers to form first and second recesses, respectively, and simultaneously forming first electrically conductive layers and second electrically conductive layers in the first and the second recesses, respectively.

BRIEF DESCRIPTION OF THE DRAWINGS

FIG. 4A is a top-down view of the exemplary structure after formation of sacrificial memory opening fill structures in the device region and sacrificial support opening fill structures in the stepped surface region according to an embodiment of the present disclosure.

FIG. 4B is a vertical cross-sectional view of the exemplary structure of FIG. 4A along the vertical plane B-B'.

FIG. 5A is a top-down view of the exemplary structure after formation of a second stack of an alternating plurality of second electrically insulating layers and second sacrificial material layers, second stepped surfaces within the stepped surface region, and a second dielectric material portion according to an embodiment of the present disclosure.

FIG. 5B is a vertical cross-sectional view of the exemplary structure of FIG. 5A along the vertical plane B-B'.

FIG. 6A is a top-down view of the exemplary structure after formation of second memory openings in the device region and second support openings in the stepped surface region according to an embodiment of the present disclosure.

FIG. 6B is a vertical cross-sectional view of the exemplary structure of FIG. 6A along the vertical plane B-B'.

FIG. 7A is a top-down view of the exemplary structure after formation of inter-stack memory openings in the device region and inter-stack support openings in the stepped surface region according to an embodiment of the present disclosure.

FIG. 7B is a vertical cross-sectional view of the exemplary structure of FIG. 7A along the vertical plane B-B'.

FIG. 8A is a top-down view of the exemplary structure after simultaneous formation of memory stack structures in the device region and support pillar structures in the stepped surface region according to an embodiment of the present disclosure.

FIG. 8B is a vertical cross-sectional view of the exemplary structure of FIG. 8A along the vertical plane B-B'.

FIG. 9A is a top-down view of the exemplary structure after formation of a backside contact trench according to an embodiment of the present disclosure.

FIG. 9B is a vertical cross-sectional view of the exemplary structure of FIG. 9A along the vertical plane B-B'.

FIG. 10A is a top-down view of the exemplary structure after formation of backside recesses according to an embodiment of the present disclosure.

FIG. 10B is a vertical cross-sectional view of the exemplary structure of FIG. 10A along the vertical plane B-B'.

FIG. 11A is a top-down view of the exemplary structure after formation of electrically conductive layers according to an embodiment of the present disclosure.

FIG. 11B is a vertical cross-sectional view of the exemplary structure of FIG. 11A along the vertical plane B-B'.

FIG. 12A is a top-down view of the exemplary structure after formation of an insulating spacer and a backside contact via structure according to an embodiment of the present disclosure.

FIG. 12B is a vertical cross-sectional view of the exemplary structure of FIG. 12A along the vertical plane B-B'.

FIG. 14A is a top-down view of the exemplary structure after formation of various contact via structures according to an embodiment of the present disclosure.

DETAILED DESCRIPTION

Figure 1:
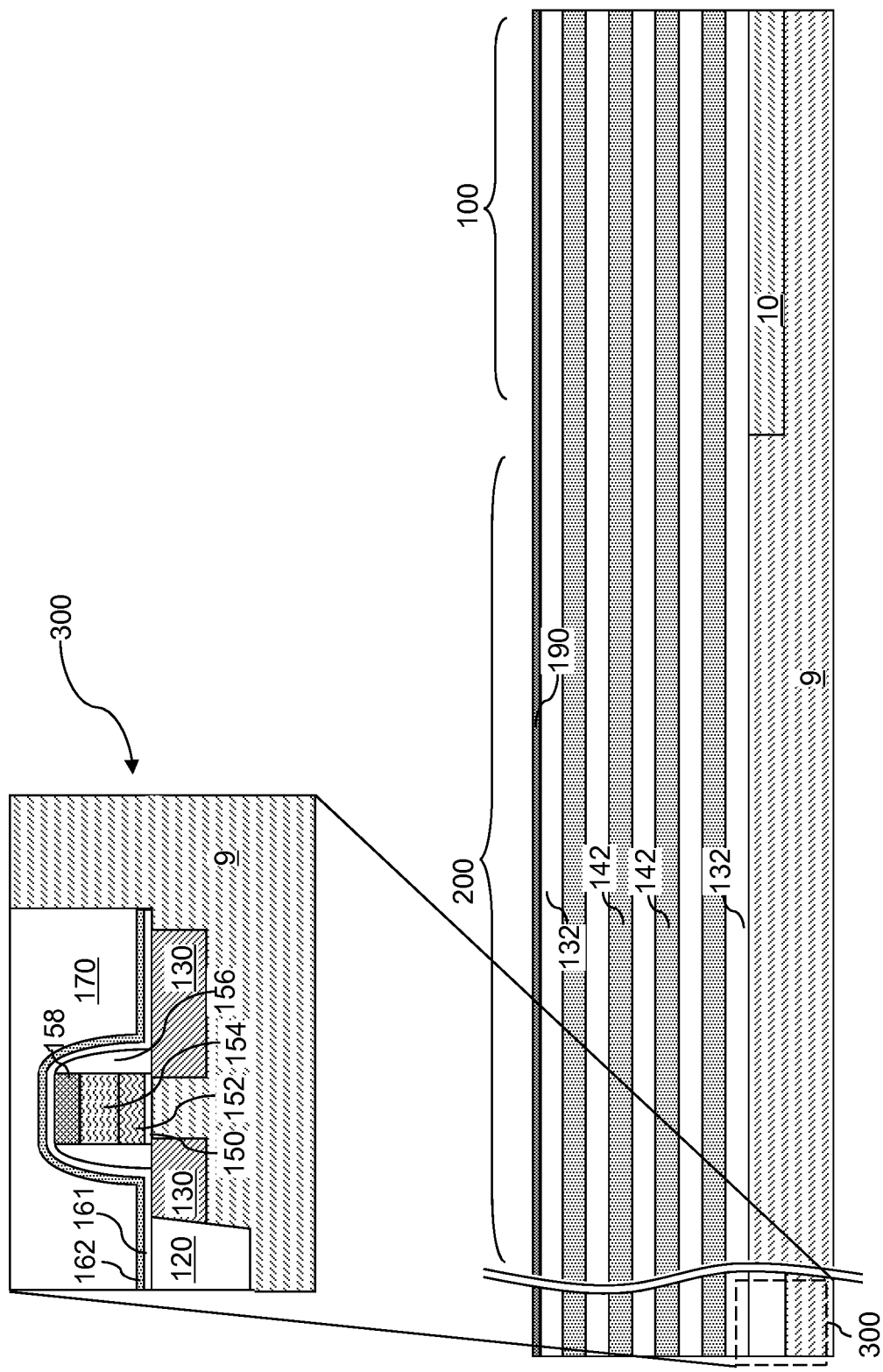
FIG. 1 is a vertical cross-sectional view of an exemplary structure after formation of a first stack of an alternating plurality of first electrically insulating layers and first sacrificial material layers and subsequent formation of an etch stop dielectric layer according to an embodiment of the present disclosure.

As discussed above, the present disclosure is directed to three-dimensional memory devices including a vertical stack of multilevel memory arrays and methods of making the same, the various aspects of which are described below. An embodiment of the disclosure can be employed to form semiconductor devices such as three-dimensional monolithic memory array devices comprising a plurality of NAND memory strings. The drawings are not drawn to scale. Multiple instances of an element may be duplicated where a single instance of the element is illustrated, unless absence of duplication of elements is expressly described or clearly indicated otherwise. Ordinals such as "first," "second," and "third" are employed merely to identify similar elements, and different ordinals may be employed across the specification and the claims of the instant disclosure. As used herein, a first element located "on" a second element can be located on the exterior side of a surface of the second element or on the interior side of the second element. As used herein, a first element is located "directly on" a second element if there exist a physical contact between a surface of the first element and a surface of the second element.

As used herein, a "layer" refers to a material portion including a region having a substantially uniform thickness. A layer may extend over the entirety of an underlying or overlying structure, or may have an extent less than the extent of an underlying or overlying structure. Further, a layer may be a region of a homogeneous or inhomogeneous contiguous structure that has a thickness less than the thickness of the contiguous structure. For example, a layer may be located between any pair of horizontal planes between, or at, a top surface and a bottom surface of the contiguous structure. A layer may extend horizontally, vertically, and/or along a tapered surface. A substrate may be a layer, may include one or more layers therein, and/or may have one or more layer thereupon, thereabove, and/or therebelow.

A monolithic three dimensional memory array is one in which multiple memory levels are formed above a single substrate, such as a semiconductor wafer, with no intervening substrates. The term "monolithic" means that layers of each level of the array are directly deposited on the layers of each underlying level of the array. In contrast, two-dimensional arrays may be formed separately and then packaged together to form a non-monolithic memory device. For example, non-monolithic stacked memories have been constructed by forming memory levels on separate substrates and vertically stacking the memory levels, as described in U.S. Pat. No. 5,915,167 titled "Three Dimensional Structure Memory." The substrates may be thinned or removed from the memory levels before bonding, but as the memory levels are initially formed over separate substrates, such memories are not true monolithic three dimensional memory arrays. The various three-dimensional memory devices of the present disclosure include a monolithic three-dimensional NAND string memory device, and can be fabricated employing the various embodiments described herein.

Referring to FIG. 1, an exemplary structure according to an embodiment of the present disclosure is illustrated, which can be employed, for example, to fabricate a device structure containing vertical NAND memory devices. The exemplary structure includes a substrate, which can be a semiconductor substrate. The substrate can include a substrate semiconductor layer 9. The substrate semiconductor layer 9 is a semiconductor material layer, and can include at least one elemental semiconductor material, at least one III-V compound semiconductor material, at least one II-VI compound semiconductor material, at least one organic semiconductor material, or other semiconductor materials known in the art. The substrate semiconductor layer 9 can comprise a single crystalline semiconductor material.

As used herein, a "semiconductor material" refers to a material having electrical conductivity in the range from $1.0 \times 10^{-6}$ S/cm to $1.0 \times 10^{5}$ S/cm, and is capable of producing a doped material having electrical resistivity in a range from 1.0 S/cm to $1.0 \times 10^{5}$ S/cm upon suitable doping with an electrical dopant. As used herein, an "electrical dopant" refers to a p-type dopant that adds a hole to a valence band within a band structure, or an n-type dopant that adds an electron to a conduction band within a band structure. As used herein, a "conductive material" refers to a material having electrical conductivity greater than $1.0 \times 10^{5}$ S/cm. As used herein, an "insulator material" or a "dielectric material" refers to a material having electrical conductivity less than $1.0 \times 10^{-6}$ S/cm. All measurements for electrical conductivities are made at the standard condition. Optionally, at least one doped well (not expressly shown) can be formed within the substrate semiconductor layer 9.

The exemplary structure includes a device region 100, in which memory devices can be subsequently formed, and a stepped surface region 200, in which stepped surfaces are subsequently formed. At least one semiconductor device for a peripheral circuitry can be formed in a peripheral device region 300, of which the general location is illustrated by a dotted rectangle and of which detailed structures are shown in an inset. The at least one semiconductor device can include, for example, one or more field effect transistors. For example, a portion of the substrate semiconductor layer 9 may be recessed to provide the peripheral device region 300. At least one shallow trench isolation structure 120 can be formed by etching portions of the substrate semiconductor layer 9 and depositing a dielectric material therein. A gate dielectric layer, at least one gate conductor layer, and a gate cap dielectric layer can be formed over the substrate semiconductor layer 9, and can be subsequently patterned to form at least one gate structure (150, 152, 154, 158), each of which can include a gate dielectric 150, at least one gate electrode (152, 154), and a gate cap dielectric. A gate electrode (152, 154) may include a stack of a first gate electrode portion 152 and a second gate electrode portion 154. At least one gate spacer 156 can be formed around the at least one gate structure (150, 152, 154, 158) by depositing and anisotropically etching a conformal dielectric layer.

Active regions 130 can be formed in upper portions of the substrate semiconductor layer 9, for example, by introducing electrical dopants employing the at least one gate structure (150, 152, 154, 158) as masking structures. Additional masks may be employed as needed. The active region 130 can include source regions and drain regions of field effect transistors. A first dielectric liner 161 and a second dielectric liner 162 can be optionally formed. Each of the first and second dielectric liners (161, 162) can comprise a silicon oxide layer, a silicon nitride layer, and/or a dielectric metal oxide layer. In an illustrative example, the first dielectric liner 161 can be a silicon oxide layer, and the second dielectric liner 162 can be a silicon nitride layer. The least one semiconductor device for the peripheral circuitry can contain a driver circuit for memory devices to be subsequently formed, which can include at least one NAND device.

A dielectric material such as silicon oxide can be deposited over the at least one semiconductor device, and can be subsequently planarized to form a planarization dielectric layer 170. In one embodiment the planarized top surface of the planarization dielectric layer 170 can be coplanar with a top surface of the dielectric liners (161, 162). Subsequently, the planarization dielectric layer 170 and the dielectric liners (161, 162) can be removed from the device region 100 and the stepped surface region 200 to physically expose a top surface of the substrate semiconductor layer 9.

While the present disclosure is described employing an embodiment in which a recessed region is employed as a peripheral device region 300, the present disclosure can be employed with alternate embodiment in which the peripheral device region 300 is formed on a non-recessed surface of the semiconductor substrate, and the planarization dielectric layer 170 is removed from the device region and the stepped surface region 200. In this case, epitaxial deposition of a semiconductor material and a planarization process can be employed to add an additional semiconductor material to the substrate semiconductor layer 9 and to cause a top surface of the substrate semiconductor layer 9 to be coplanar with the top surface of the planarization dielectric layer 170. Yet alternately, the methods of the present disclosure can be employed in other schemes for providing a different height for the peripheral device region 300.

Optionally, a doped semiconductor material layer 10 can be formed on the top surface of the substrate semiconductor layer 9 by implantation of electrical dopants (p-type dopants or n-type dopants) into an upper portion of the substrate semiconductor layer 9, or by deposition of a single crystalline semiconductor material, for example, by selective epitaxy. The single crystalline semiconductor material of the doped semiconductor material layer 10 can be in epitaxial alignment with the single crystalline structure of the substrate semiconductor layer 9.

A stack of an alternating plurality of first material layers and second material layers is subsequently formed. Each first material layer can include a first material, and each second material layer can include a second material that is different from the first material. In one embodiment, the first material layers and the second material layers can be first electrically insulating layers 132 and first sacrificial material layers 142, respectively. In one embodiment, each first electrically insulating layer 132 can include a first electrically insulating material, and each first sacrificial material layer 142 can include a first sacrificial material. The stack formed by the first electrically insulating layers 132 and the first sacrificial material layers 142 is herein referred to as a first stack (132, 142), or a lower stack (132, 142). In this case, the stack can include an alternating plurality of first electrically insulating layers 132 and first sacrificial material layers 142. As used herein, a "sacrificial material" refers to a material that is removed during a subsequent processing step.

As used herein, an alternating plurality of first elements and second elements refers to a structure in which instances of the first elements and instances of the second elements alternate. Each instance of the first elements that is not an end element of the alternating plurality is adjoined by two instances of the second elements on both sides, and each instance of the second elements that is not an end element of the alternating plurality is adjoined by two instances of the first elements on both ends. The first elements may have the same thickness thereamongst, or may have different thicknesses. The second elements may have the same thickness thereamongst, or may have different thicknesses. The alternating plurality of first material layers and second material layers may begin with an instance of the first material layers or with an instance of the second material layers, and may end with an instance of the first material layers or with an instance of the second material layers. In one embodiment, an instance of the first elements and an instance of the second elements may form a unit that is repeated with periodicity within the alternating plurality.

The first stack (132, 142) can include first electrically insulating layers 132 composed of the first material, and first sacrificial material layers 142 composed of the second material, which is different from the first material. The first material of the first electrically insulating layers 132 can be at least one electrically insulating material. Electrically insulating materials that can be employed for the first electrically insulating layers 132 include, but are not limited to silicon oxide (including doped or undoped silicate glass), silicon nitride, silicon oxynitride, organosilicate glass (OSG), spin-on dielectric materials, dielectric metal oxides that are commonly known as high dielectric constant (high-k) dielectric oxides (e.g., aluminum oxide, hafnium oxide, etc.) and silicates thereof, dielectric metal oxynitrides and silicates thereof, and organic insulating materials. In one embodiment, the first material of the first electrically insulating layers 132 can be silicon oxide.

The second material of the first sacrificial material layers 142 is a sacrificial material that can be removed selective to the first material of the first electrically insulating layers 132. As used herein, a removal of a first material is "selective to" a second material if the removal process removes the first material at a rate that is at least twice the rate of removal of the second material. The ratio of the rate of removal of the first material to the rate of removal of the second material is herein referred to as a "selectivity" of the removal process for the first material with respect to the second material.

The first sacrificial material layers 142 may comprise an electrically insulating material, a semiconductor material, or a conductive material. The second material of the first sacrificial material layers 142 can be subsequently replaced with electrically conductive electrodes which can function, for example, as control gate electrodes of a vertical NAND device. Non-limiting examples of the second material include silicon nitride, an amorphous semiconductor material (such as amorphous silicon), and a polycrystalline semiconductor material (such as polysilicon). In one embodiment, the first sacrificial material layers 142 can be material layers that comprise silicon nitride or a semiconductor material including at least one of silicon and germanium.

In one embodiment, the first electrically insulating layers 132 can include silicon oxide, and sacrificial material layers can include silicon nitride sacrificial material layers. The first material of the first electrically insulating layers 132 can be deposited, for example, by chemical vapor deposition (CVD). For example, if silicon oxide is employed for the first electrically insulating layers 132, tetraethylorthosilicate (TEOS) can be employed as the precursor material for the CVD process. The second material of the first sacrificial material layers 142 can be formed, for example, CVD or atomic layer deposition (ALD).

The first sacrificial material layers 142 can be suitably patterned so that conductive material portions to be subsequently formed by replacement of the first sacrificial material layers 142 can function as electrically conductive electrodes, such as the control gate electrodes of the monolithic three-dimensional NAND string memory devices to be subsequently formed. The first sacrificial material layers 142 may comprise a portion having a strip shape extending substantially parallel to the top surface of the substrate (9, 10).

The thicknesses of the first electrically insulating layers 132 and the first sacrificial material layers 142 can be in a range from 20 nm to 50 nm, although lesser and greater thicknesses can be employed for each first electrically insulating layer 132 and for each first sacrificial material layer 142. The number of repetitions of the pairs of a first electrically insulating layer 132 and a first sacrificial material layer 142 can be in a range from 2 to 1,024, and typically from 8 to 256, although a greater number of repetitions can also be employed. In one embodiment, each first sacrificial material layer 142 in the first stack (132, 142) can have a uniform thickness that is substantially invariant within each respective first sacrificial material layer 142.

Optionally, an etch stop dielectric layer 190 can be added to the top surface of the first stack (132, 142) by deposition of an etch stop dielectric material. The etch stop dielectric material is a material having a different composition than the materials of the first electrically insulating layers 132 and the first sacrificial material layers 142. For example, the etch stop dielectric layer 190 can include a dielectric metal oxide (such as aluminum oxide, lanthanum oxide, or hafnium oxide), or can include a carbon-based material (such as amorphous carbon, diamond-like carbon, or a carbon-containing dielectric material). The thickness of the etch stop dielectric layer 190 can be in a range from 1 nm to 30 nm, although lesser and greater thicknesses can also be employed. A lower stack structure is formed, which includes the first stack (132, 142) and the etch stop dielectric layer 190.

Figure 2:
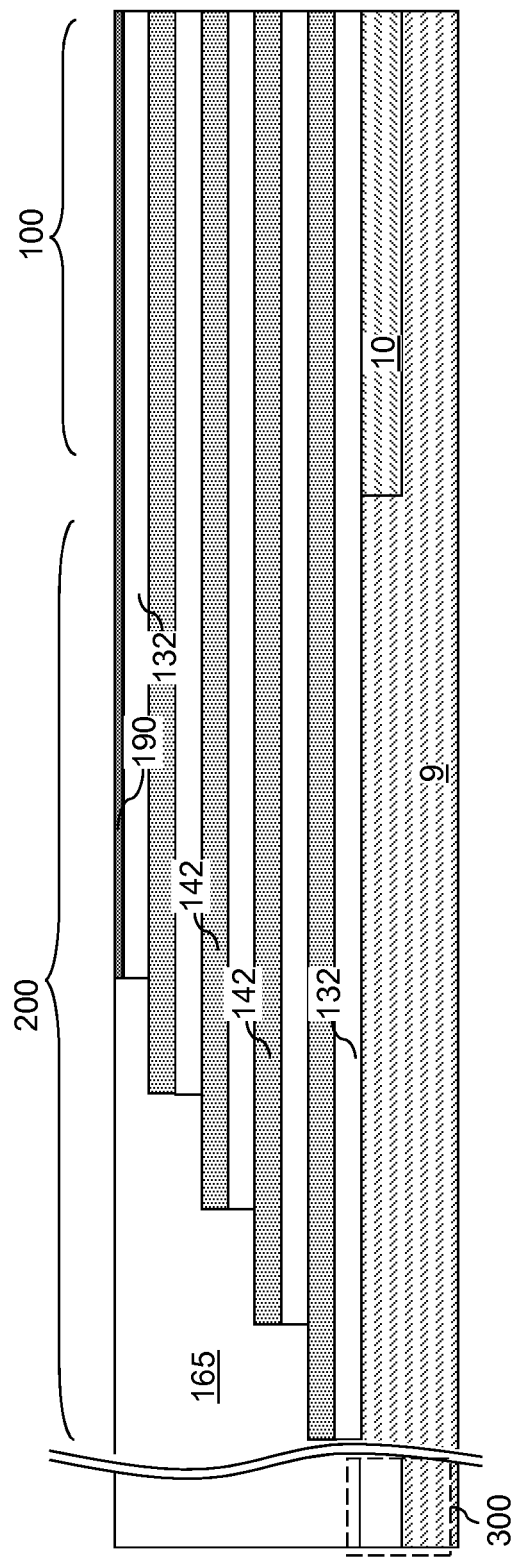
FIG. 2 is a vertical cross-sectional view of the exemplary structure after formation of first stepped surfaces and a first dielectric material portion according to an embodiment of the present disclosure.

Referring to FIG. 2, the lower stack structure (132, 142, 190) can be patterned to form first stepped surfaces. The first stepped surfaces are formed in the stepped surface region 200. The stepped surface region 200 includes a first stepped surface region in which the first stepped surfaces are formed, and a second stepped surface region in which additional stepped surfaces are to be subsequently formed in an upper stack structure to be subsequently formed over the lower stack structure. The device region 100 is provided adjacent to the stepped surface region 200. Memory devices including memory stack structures can be subsequently formed in the device region 100. The first stepped surfaces can be formed, for example, by forming a mask layer with an opening therein, etching a cavity within the levels of the topmost first sacrificial material layer 142 and the topmost first electrically insulating layer 132, and iteratively expanding the etched area and vertically recessing the cavity by etching each pair of a first electrically insulating layer 132 and a first sacrificial material layer 142 located directly underneath the bottom surface of the etched cavity within the etched area. The first stack (132, 142) is patterned such that each underlying first sacrificial material layer 142 laterally protrudes farther than any overlying first sacrificial material layer 142 in the etched region, and each underlying first electrically insulating layer 132 laterally protrudes farther than any overlying first electrically insulating layer 132 in the etched region. The stepped surface region can be a contact region of the first stack (132, 142). The cavity is herein referred to as a first stepped cavity.

A dielectric material is deposited to fill the first stepped cavity. Excess portions of the dielectric material overlying the topmost surface of the first stack (132, 142), are removed for example, by chemical mechanical planarization. The remaining portion of the deposited dielectric material forms a first dielectric material portion 165, which is formed on the first stepped surfaces. The first dielectric material portion 165 is retro-stepped, i.e., is a retro-stepped dielectric material portion 165. As used herein, a "retro-stepped" element refers to an element that has stepped surfaces and a horizontal cross-sectional area that increases monotonically as a function of a vertical distance from a top surface of a substrate on which the element is present. The lower stack structure, which is also referred to as a first stack structure, comprises the first stack (132, 142), the etch stop dielectric layer 190, and the first dielectric material portion 165 (which can be a retro-stepped dielectric material portion).

Figure 3A:
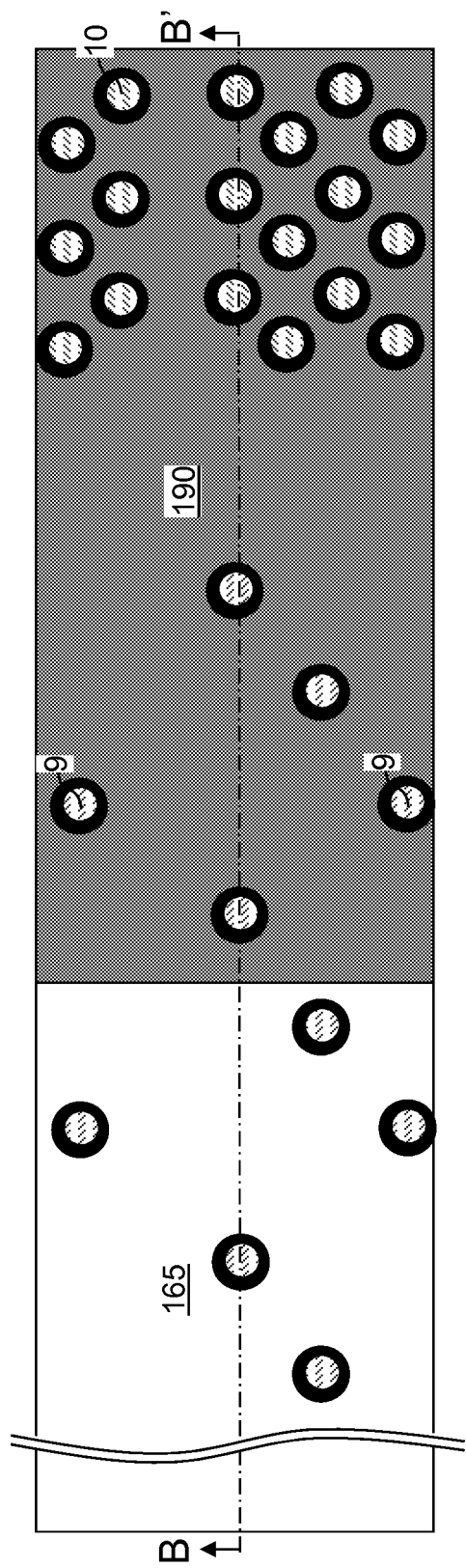
FIG. 3A is a top-down view of the exemplary structure after formation of first memory openings in a device region and first support openings in a stepped surface region according to an embodiment of the present disclosure.
Figure 3B:
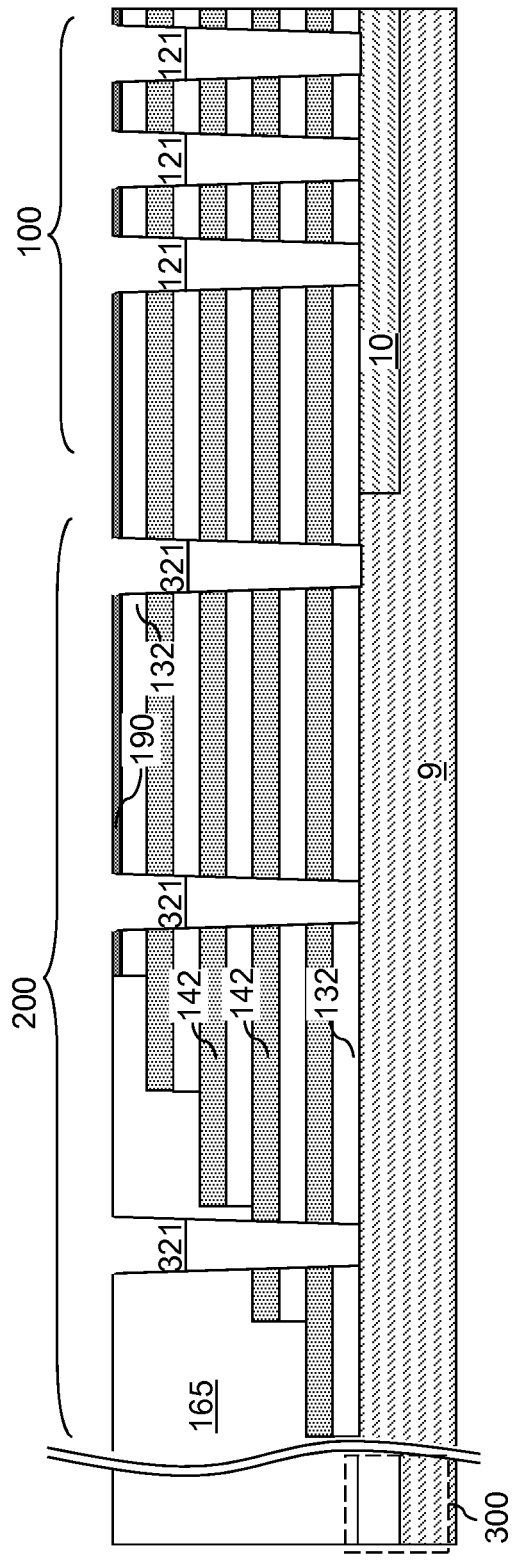
FIG. 3B is a vertical cross-sectional view of the exemplary structure of FIG. 3A along the vertical plane B-B'.

Referring to FIGS. 3A and 3B, first openings (121, 321) are formed through the lower stack structure (132, 142, 190, 165) to a top surface of the substrate (9, 10). The first openings (121, 321) include first memory openings 121 that are formed in the device region 100 and first support openings 321 that are formed in the stepped surface region 200. For example, a lithographic material stack (not shown) including at least a photoresist layer can be formed over the lower stack structure (132, 142, 190, 165), and can be lithographically patterned to form openings within the lithographic material stack. The pattern in the lithographic material stack can be transferred through the entirety of the lower stack structure (132, 142, 190, 165) by at least one anisotropic etch that employs the patterned lithographic material stack as an etch mask. Portions of the lower stack structure (132, 142, 190, 165) underlying the openings in the patterned lithographic material stack are etched to form the first openings (121, 321). In other words, the transfer of the pattern in the patterned lithographic material stack through the lower stack structure (132, 142, 190, 165) forms the first openings (121, 321).

In one embodiment, the chemistry of the anisotropic etch process employed to etch through the materials of the first stack (132, 142) can alternate to optimize etching of the first and second materials in the first stack (132, 142) while providing a comparable average etch rate for the first dielectric material portion 165. The anisotropic etch can be, for example, a series of reactive ion etches. The sidewalls of the first openings (121, 321) can be substantially vertical, or can be tapered. Subsequently, the patterned lithographic material stack can be subsequently removed, for example, by ashing.

The first support openings 321 are formed through the first stack of alternating layers (132, 142) and through one of the first dielectric material portion 165 and the etch stop dielectric layer 190 concurrently with formation of the first memory openings 121, which are formed through the etch stop dielectric layer 190 and the first stack of alternating layers (132, 142). In one embodiment, the substrate (9, 10) can be employed as a stopping layer for the anisotropic etch process. In one embodiment, the first openings (121, 321) may extend below the top surface of the substrate (9, 10) by an overetch. The lateral dimensions (e.g., a diameter) of the first openings (121, 321) can be from about 20 nm to 200 nm at an upper portion of each first opening (121, 321), and can be about 10 nm to 150 nm at a lower portion of each first opening (121, 321). In one embodiment, the first memory openings 121 can be formed as an array of openings, which can be a periodic two-dimensional array of openings. The first support openings 321 can be formed as discrete openings that are mutually separated from one another, and may not form a periodic two-dimensional array pattern. The nearest neighbor lateral separation distance among the first support openings 321 may be greater than twice (e.g., three times or more) than the nearest neighbor distance among the first memory openings 121.

Referring to FIGS. 4A and 4B, a sacrificial fill material is deposited in the first openings (121, 321) to form sacrificial fill structures (123, 323). The sacrificial fill structures (123, 323) include sacrificial memory opening fill structures 123 that fill the first memory openings 121 in the device region 100 and sacrificial support opening fill structures 323 that fill the first support openings 321 in the stepped surface region 200. The first support opening 321 and the first memory openings 121 are concurrently filled with the sacrificial fill material.

The sacrificial fill material is a material that can be removed selective to the materials of the lower stack structure (132, 142, 190, 165) and to the substrate (9, 10). The sacrificial fill material can include, for example, germanium, a silicon-germanium alloy, amorphous carbon, diamond-like carbon, or a porous organosilicate glass. The sacrificial fill material can be deposited, for example, by chemical vapor deposition (CVD) or spin coating. Excess portions of the sacrificial fill material over the top surface of the lower stack structure (132, 142, 190, 165) can be removed, for example, by a planarization process. Each sacrificial memory opening fill structure 123 is a first memory opening fill structure, i.e., a fill structure that fills the volume of a first memory opening 121. Each sacrificial support opening fill structure 323 is a first support opening fill structure, i.e., a fill structure that fills the volume of a first support opening 321.

Referring to FIGS. 5A and 5B, a second stack (232, 242) of an alternating plurality of material layers is subsequently formed on the top surface of the lower stack structure (132, 142, 190, 165). The second stack (232, 242) includes an alternating plurality of third material layers and fourth material layers. Each third material layer can include a third material, and each fourth material layer can include a fourth material that is different from the third material. In one embodiment, the third material can be the same as the first material of the first electrically insulating layer 132, and the fourth material can be the same as the second material of the first sacrificial material layers 142.

In one embodiment, the third material layers and the fourth material layers can be second electrically insulating layers 232 and second sacrificial material layers 242, respectively. The third material of the second electrically insulating layers 232 can be at least one electrically insulating material. The fourth material of the second sacrificial material layers 242 is a sacrificial material that can be removed selective to the third material of the second electrically insulating layers 232. The second sacrificial material layers 242 may comprise an electrically insulating material, a semiconductor material, or a conductive material. The fourth material of the second sacrificial material layers 242 can be subsequently replaced with electrically conductive electrodes which can function, for example, as control gate electrodes of a vertical NAND device.

In one embodiment, each second electrically insulating layer 232 can include a second electrically insulating material, and each second sacrificial material layer 242 can include a second sacrificial material. In this case, the second stack (232, 242) can include an alternating plurality of second electrically insulating layers 232 and second sacrificial material layers 242. The third material of the second electrically insulating layers 232 can be deposited, for example, by chemical vapor deposition (CVD). The fourth material of the second sacrificial material layers 242 can be formed, for example, CVD or atomic layer deposition (ALD).

The third material of the second electrically insulating layers 232 can be at least one electrically insulating material. Electrically insulating materials that can be employed for the second electrically insulating layers 232 can be any material that can be employed for the first electrically insulating layers 132. The fourth material of the second sacrificial material layers 242 is a sacrificial material that can be removed selective to the third material of the second electrically insulating layers 232. Sacrificial materials that can be employed for the second sacrificial material layers 242 can be any material that can be employed for the first sacrificial material layers 142. In one embodiment, the second electrically insulating material can be the same as the first electrically insulating material, and the second sacrificial material can be the same as the first sacrificial material.

The thicknesses of the second electrically insulating layers 232 and the second sacrificial material layers 242 can be in a range from 20 nm to 50 nm, although lesser and greater thicknesses can be employed for each second electrically insulating layer 232 and for each second sacrificial material layer 242. The number of repetitions of the pairs of a second electrically insulating layer 232 and a second sacrificial material layer 242 can be in a range from 2 to 1,024, and typically from 8 to 256, although a greater number of repetitions can also be employed. In one embodiment, each second sacrificial material layer 242 in the second stack (232, 242) can have a uniform thickness that is substantially invariant within each respective second sacrificial material layer 242.

Additional stepped surfaces are formed in the second stack (232, 242) in the stepped surface region 200 in a manner such that the additional stepped surfaces are formed in an area that is adjacent to, and does not overlie, the area of the stepped surfaces within the lower stack structure (132, 142, 190, 165). The additional stepped surfaces can be adjacent to, and do not overlie, the stepped interface between the first stack (132,1 42) and the first dielectric material portion 165.

The additional stepped surfaces are herein referred to second stepped surfaces, and can be formed, for example, by forming a mask layer with an opening therein, etching a cavity within the levels of the topmost second sacrificial material layer 242 and the topmost second electrically insulating layer 232, and iteratively expanding the etched area and vertically recessing the cavity by etching a pair of a second electrically insulating layer 232 and a second sacrificial material layer 242 located directly underneath the bottom surface of the etched cavity within the etched area. The second stack (232, 242) is patterned such that each underlying second sacrificial material layer 242 laterally protrudes farther than any overlying second sacrificial material layer 242 in the etched region, and each underlying second electrically insulating layer 232 laterally protrudes farther than any overlying second electrically insulating layer 232 in the etched region. The etched region is the stepped surface region 200, and includes a contact region for the second stack (232, 242) and a contact region for the first stack (132, 142). As used herein, a "contact region" refers to a region in which contact via structures are to be formed.

Thus, the second stack (232, 242) is patterned to form the second stepped surfaces thereupon. The cavity formed by removal of portions of the second stack (232, 242) is herein referred to as a second stepped cavity. The area of the second stepped cavity includes the area of the retro-stepped first dielectric material portion 165, from which all layers of the second stack (232, 242) are removed. The area of the second stepped cavity further includes the area of the second stepped surfaces of the second stack (232, 242).

Dielectric material is deposited to fill the second stepped cavity. Excess portions of the dielectric material overlying the topmost surface of the second stack (232, 242) are removed, for example, by chemical mechanical planarization. The remaining portion of the deposited dielectric material forms a second dielectric material portion 265. The second dielectric material portion 265 is located on, and over, the second stepped surfaces of the second stack (232, 242). The second dielectric material portion 265 is retro-stepped. The second dielectric material portion 265 is formed on the second stepped surfaces. The stepped surface region comprises a region of the first stepped surfaces and a region of the second stepped surfaces.

Referring to FIGS. 6A and 6B, second openings (221, 421) are formed through the upper stack structure (232, 242, 265) to the top surface of the lower stack structure (132, 142, 190, 165). The second openings (221, 421) include second memory openings 221 that are formed in the device region 100 and second support openings 421 that are formed in the stepped surface region 200. Each second memory opening 221 can be formed in an area that substantially coincides with the area of a respective first memory opening 121. Each second support opening 421 can be formed in an area that substantially coincides with the area of a respective first support opening 321.

For example, a lithographic material stack (not shown) including at least a photoresist layer can be formed over the upper stack structure (232, 242, 265), and can be lithographically patterned to form openings within the lithographic material stack. The pattern in the lithographic material stack can be transferred through the entirety of the upper stack structure (232, 242, 265) by at least one anisotropic etch that employs the patterned lithographic material stack as an etch mask. Portions of the upper stack structure (232, 242, 265) underlying the openings in the patterned lithographic material stack are etched to form the second openings (221, 421). In other words, the transfer of the pattern in the patterned lithographic material stack through the upper stack structure (232, 242, 265) forms the second openings (221, 421).

In one embodiment, the chemistry of the anisotropic etch process employed to etch through the materials of the second stack (232, 242) can alternate to optimize etching of the third and fourth materials in the second stack (232, 242) while providing a comparable average etch rate for the second dielectric material portion 265. The anisotropic etch can be, for example, a series of reactive ion etches. The sidewalls of the second openings (221, 421) can be substantially vertical, or can be tapered.

The second memory openings (221, 421) are formed through the upper stack structure (232, 242, 265) in areas overlying the first memory openings (121, 321), which are filled with the sacrificial opening fill structures (123, 323). The second support opening 421 can be formed through the second stack of alternating layers (232, 242) and through the second dielectric material portion 265 concurrently with formation of the second memory openings 221, which are formed through the second stack of alternating layers (232, 242). In one embodiment, the sacrificial opening fill structures (123, 323) can be employed as an endpoint detection layer to control the termination time of the anisotropic etch process. In one embodiment, the second openings (221, 421) may extend below the top surface of the sacrificial opening fill structures (123, 323) by an overetch. The lateral dimensions (e.g., a diameter) of the second openings (221, 421) can be comparable to the lateral dimensions of the first openings (121, 321). For example, the lateral dimensions of the second openings (221, 421) can be from about 20 nm to 200 nm at an upper portion of each second opening (221, 421), and can be about 10 nm to 150 nm at a lower portion of each second opening (221, 421). In one embodiment, the second memory openings 221 and the first memory openings 121 can be formed as an array of openings, which can be a periodic two-dimensional array of openings. The second support openings 421 and the first support openings 321 can be formed as discrete openings that are mutually separated from one another, and may not form a periodic two-dimensional array pattern. The nearest neighbor lateral separation distance among the second support openings 421 may be greater than twice (e.g., three time or more) than the nearest neighbor distance among the second memory openings 221.

Each bottom surface of the second memory openings 221 can be entirely within the area of a top surface of an underlying sacrificial memory opening fill structure 123. Each bottom surface of the second support openings 421 can be entirely within the area of a top surface of an underlying sacrificial support opening fill structure 323. Subsequently, the patterned lithographic material stack can be subsequently removed, for example, by ashing.

Referring to FIGS. 7A and 7B, the sacrificial fill material is removed from within the first openings (121, 321) and underneath the second openings (321, 421) to form inter-stack openings (49, 59) that extend through the lower stack structure (132, 142, 190, 165) and the upper stack structure (232, 242, 265). A selective etch process that removes the sacrificial material of the sacrificial memory opening fill structures 123 and the sacrificial support opening fill structures 323 can be employed. The selective etch process can be an isotropic etch process or an anisotropic etch process.

Specifically, the sacrificial fill material of the sacrificial memory opening fill structures 123 is removed from underneath the second memory openings 321 to form inter-stack memory openings 49. Each inter-stack memory opening 49 includes a volume of a vertically adjoining pair of a first memory opening 121 and a second memory opening 221, and extends at least between a first horizontal plane including a bottom surface of the lower stack structure (132, 142, 190, 165) to a top surface of the upper stack structure (232, 242, 265). Simultaneously with the removal of the sacrificial fill material of the sacrificial memory opening fill structures 123, the sacrificial fill material of the sacrificial support openings fill structures 323 is removed from underneath the second support openings 421 to form inter-stack support openings 59. Each inter-stack support opening 59 includes a volume of a vertically adjoining pair of a first support opening 321 and a second support opening 421, and extends at least between the first horizontal plane including the bottom surface of the lower stack structure (132, 142, 190, 165) to the top surface of the upper stack structure (232, 242, 265). The inter-stack memory openings 49 and the inter-stack support openings 59 are multi-level memory openings containing a first-level opening within the first stack (132, 142) and a second-level opening in the second stack (232, 242).

Each inter-stack memory opening 49 includes an optional notch 149 and each inter-stack support opening 59 includes an optional notch 159 at the interface between the first (lower) and the second (upper) stacks. The notch (149, 159) results from a taper in the separate etches of the openings (121, 321) and (221, 421), such that the narrower bottom portion of the openings (221, 421) contacts a wider top portion of the respective openings (121, 321). This results in a non-straight sidewall of the openings (49, 59) (e.g., a jagged sidewall protrusion at the notch which may include an exposed horizontal surface of the etch stop layer or one of the stack layers). In other words, the openings (49, 59) have a non-uniform taper along the axial direction, such that the decreasing taper increases at the notch.

Referring to FIGS. 8A and 8B, memory stack structures 55 and support pillar structures 155 can be simultaneously formed in the inter-stack memory openings 49 in the device region 100 and in the inter-stack support openings 59 in the stepped surface region 200, respectively. In one embodiment, each memory stack structure 55 and each support pillar structure 155 can have an identical set of elements. In other words, the set of all materials present within each memory stack structure 55 can be the same as the set of all materials present within each support pillar structure 155. Each memory stack structure 55 is formed by filling an inter-stack memory opening 49 with a set of materials, and each support pillar structure 155 is formed by filling an inter-stack support opening 59 with the same set of materials deposited in the same processing (e.g., deposition) steps.

In one embodiment, a memory film 50 can be formed on each sidewall of the inter-stack memory openings 49 and the inter-stack support openings 59. In one embodiment, the memory film 50 can include a layer stack including, from outside to inside, a blocking dielectric layer, a memory material layer, and a tunneling dielectric layer.

For example, the blocking dielectric layer can be formed on the sidewalls of the inter-stack memory openings 49 and the inter-stack support openings 59. The blocking dielectric layer may include one or more dielectric material layers that can function as the dielectric material(s) of control gate dielectrics for control gate electrodes to be subsequently formed. The blocking dielectric layer can include silicon oxide, a dielectric metal oxide, a dielectric metal oxynitride, or a combination thereof. In one embodiment, the blocking dielectric layer can include a stack of at least one silicon oxide layer and at least one dielectric metal oxide layer. The blocking dielectric layer can be formed by a conformal deposition process such as chemical vapor deposition (CVD) and/or atomic layer deposition (ALD), and/or by deposition of a conformal material layer (such as an amorphous silicon layer) and subsequent conversion of the conformal material layer into a dielectric material layer (such as a silicon oxide layer). The thickness of the blocking dielectric layer can be in a range from 6 nm to 24 nm, although lesser and greater thicknesses can also be employed. Alternatively, the blocking dielectric layer may be omitted from the memory opening, and instead be formed through a backside contact trench and backside recesses prior to forming electrically conductive layers that function as control gate electrodes.

The memory material layer can include a charge storage layer. In this case, the charge storage layer can include a dielectric charge trapping material, which can be, for example, silicon nitride, or a conductive material such as doped polysilicon or a metallic material. In one embodiment, the charge storage layer includes silicon nitride. The charge storage layer can be formed as a single charge storage layer of homogeneous composition, or can include a stack of multiple charge storage material layers. The multiple charge storage material layers, if employed, can comprise a plurality of spaced-apart floating gate material layers that contain conductive materials (e.g., metal such as tungsten, molybdenum, tantalum, titanium, platinum, ruthenium, and alloys thereof, or a metal silicide such as tungsten silicide, molybdenum silicide, tantalum silicide, titanium silicide, nickel silicide, cobalt silicide, or a combination thereof) and/or semiconductor materials (e.g., polycrystalline or amorphous semiconductor material including at least one elemental semiconductor element or at least one compound semiconductor material). Alternatively or additionally, the charge storage layer may comprise an insulating charge trapping material, such as one or more silicon nitride segments. Alternatively, the charge storage layer may comprise conductive nanoparticles such as metal nanoparticles, which can be, for example, ruthenium nanoparticles. The charge storage layer can be formed, for example, by chemical vapor deposition (CVD), atomic layer deposition (ALD), physical vapor deposition (PVD), or any suitable deposition technique for the selected material(s) for the charge storage layer. The thickness of the charge storage layer can be in a range from 2 nm to 20 nm, although lesser and greater thicknesses can also be employed.

The tunnel dielectric layer includes a dielectric material through which charge tunneling can be performed under suitable electrical bias conditions. The charge tunneling may be performed through hot-carrier injection or by Fowler-Nordheim tunneling induced charge transfer depending on the mode of operation of the monolithic three-dimensional NAND string memory device to be formed. The tunneling dielectric layer can include silicon oxide, silicon nitride, silicon oxynitride, dielectric metal oxides (such as aluminum oxide and hafnium oxide), dielectric metal oxynitride, dielectric metal silicates, alloys thereof, and/or combinations thereof. In one embodiment, the tunneling dielectric layer can include a stack of a first silicon oxide layer, a silicon oxynitride layer, and a second silicon oxide layer, which is commonly known as an ONO stack. In one embodiment, the tunneling dielectric layer can include a silicon oxide layer that is substantially free of carbon or a silicon oxynitride layer that is substantially free of carbon. The thickness of the tunnel dielectric layer can be in a range from 2 nm to 20 nm, although lesser and greater thicknesses can also be employed. The blocking dielectric layer, the memory material layer, and the tunneling dielectric layer collectively constitute a memory film 50.

The memory film 50 can be deposited as a layer stack of contiguous layers. An anisotropic etch can be performed to etch horizontal portions of the memory film 50 from above the upper stack structure (232, 242, 265) and at the bottom of each interstack opening (49, 59). The remaining portions of the memory film 50 are vertical portions that are located within a respective inter-stack opening (49, 59), include an opening at a bottom portion to physically expose a semiconductor surface of the substrate (9, 10), and are isolated from one another. An opening can be formed through each horizontal portion of the memory film 50 at the bottom of each inter-stack opening (49, 59) by the anisotropic etch.

A semiconductor channel 60 is formed within each inter-stack opening (49, 59) and directly on an inner sidewall of each memory film 50. The semiconductor channel 60 can be formed by depositing at least one semiconductor material on the inner sidewalls of the memory films 50 and on semiconductor surfaces of the semiconductor substrate (9, 10). The semiconductor material of the semiconductor channel 60 can include a doped polycrystalline semiconductor material (such as doped polysilicon), or can include a doped amorphous semiconductor material (such as amorphous silicon) that can be subsequently converted into a doped polycrystalline semiconductor material after a suitable anneal at an elevated temperature. In one embodiment, each semiconductor channel 60 can be a single semiconductor channel extending through the upper stack structure (232, 242, 265) the lower stack structure (132, 142, 190, 165).

A dielectric core 62 can be formed within a cavity inside each semiconductor channel 60, for example, by deposition of a dielectric material such as silicon oxide, and subsequent planarization of the dielectric material. Planarization of the dielectric material can be performed to remove the portion of the deposited dielectric material from above the top surface of the horizontal plane including the top surface of the topmost layer of the upper stack structure. The planarization of the dielectric material can be performed, for example, by chemical mechanical planarization. The remaining dielectric material portions can be recessed below the top surface of the upper stack structure, for example, by a recess etch. Each remaining portion of the dielectric material inside a memory opening constitutes a dielectric core 62. The dielectric core 62 is an optional component, and a combination of a memory film 50 and a semiconductor channel 60 may completely fill a memory opening.

A drain region 63 can be formed on the top portion of each semiconductor channel 60, for example, by deposition of a doped semiconductor material. If the semiconductor channels 60 comprise a doped semiconductor material, the conductivity type of the drain regions 63 can be the opposite of the conductivity type of the semiconductor channels 60. In one embodiment, the semiconductor channels 60 and the doped semiconductor material layer 10 collectively constitute the channels of vertical stacks of field effect transistors embodied within a vertical memory stack structure such as a vertical NAND structure.

Each set of a memory film 50, a semiconductor channel 60, a dielectric core 62, and a drain region 63 within an inter-stack memory opening 49 constitutes a memory stack structure 55. Each set of a memory film 50, a semiconductor channel 60, a dielectric core 62, and a drain region 63 within an inter-stack support opening 59 constitutes a support pillar structure 155. The support pillar structures 155 do not provide any electrical functionality, but are employed to provide mechanical support during manufacture of the device in the exemplary structure, for example, by preventing collapse of material layers during subsequent formation of backside recesses. Further, the support pillar structures 155 can be employed to provide mechanical support after manufacture, and during operation, of the device in the exemplary structure.

Each support pillar structure 155 can comprises a dummy semiconductor channel 60 having the same composition as, and the same thickness as, a semiconductor channel 60 in a memory stack structure 55. The dummy semiconductor channel 155 is not electrically connected to a driver circuit of the monolithic three-dimensional memory device. As used herein, a first element is electrically connected to a second element if the first element contacts the second element or a conductive path (a path consisting of at least one conductive material) is present between the first element and the second element.

In one embodiment, each support pillar structure 155 can comprise a dummy memory film 50 including a dummy memory material layer having the same composition as, and the same thickness as, the memory film in a memory stack structure 55. Each support pillar structure 155 can comprise a dummy tunneling dielectric layer having the same composition as, and the same thickness as, the tunneling dielectric layer.

The support pillar structures 155 do not perform any electrical function. Thus, no charge is stored in the dummy memory film during operation of the monolithic three-dimensional memory device. No charge carriers tunnel through the dummy tunneling dielectric layer during operation of the monolithic three-dimensional memory device. No current flows through the dummy semiconductor channel during operation of the monolithic three-dimensional memory device.

Each support pillar structure 155 is an electrically inactive component, i.e., a component that does not function electrically, by virtue of not being electrically shorted to a conductive component except for the semiconductor material of the semiconductor substrate (9, 10). Each semiconductor pillar structure 155 includes a memory film 50 which is a dummy memory film (i.e., an electrically inactive memory film), a semiconductor channel 60 which is a dummy semiconductor channel (i.e., an electrically inactive semiconductor channel), a dielectric core 62, and a drain region 63 which is a dummy drain region (i.e., an electrically inactive drain region).

Each dummy memory film 50 in the at least one support pillar structure 155 is formed during the same step as the memory film 50 in each memory stack structure 55. Each dummy tunneling dielectric layer in the at least one support pillar structure 155 is formed during the same step as the tunneling dielectric layer in each memory stack structure 55. Each dummy semiconductor channel 60 in the at least one support pillar structure 155 is formed during the same step as the semiconductor channel 60 in each memory stack structure 55. Each dummy drain region 63 in the at least one support pillar structure 155 is formed during the same step as the drain region 63 in each memory stack structure 55.

Referring to FIGS. 9A and 9B, a photoresist layer (not shown) can be applied over the exemplary and lithographically patterned to an opening in an area between groups of memory stack structures 55 within the device region 100. The pattern in the photoresist layer can be transferred through the upper stack structure (232, 242, 265) and the lower stack structure (132, 142, 190, 165) employing an anisotropic etch to form the at least one backside contact trench 79, which can extend to the top surface of the substrate (9, 10). In one embodiment, the etch chemistry can employ a hydrofluorocarbon based etchant gas or a hydrochlorocarbon based etchant gas. In one embodiment, the at least one backside contact trench 79 can include a source contact opening in which a source contact via structure can be subsequently formed. In one embodiment, the at least one backside contact trench 79 can be formed through the upper stack structure (232, 242, 265) and the lower stack structure (132, 142, 190, 165) in a same etching step;

A source region 61 can be formed in each surface portion of the semiconductor material layer 10 that underlies the at least one backside contact trench 79. Each source region 61 can be formed by implanting electrical dopants of the same conductivity type as the doping type of the drain regions 63. In one embodiment, each source region 61 can be formed by ion implantation and/or plasma doping. In one embodiment, at least the portion of the semiconductor material layer 10 underlying the memory stack structures 55 and the at least one backside contact trench 79 can have a doping of a first conductivity type (which can be p-type or n-type), and the at least one source region 61 and the drain regions 63 can have a doping of a second conductivity type that is the opposite of the first conductivity type. The semiconductor channels 60 can have a doping of the first conductivity type, or can be intrinsic.

Referring to FIGS. 10A and 10B, at least one etchant that selectively etches the second material of the first sacrificial material layers 142 and/or the fourth material of the second sacrificial material layers 242 with respect to the first material of the first electrically insulating layers 132 and the third material of the second electrically insulating layers 232 can be introduced into the backside contact trench 79, for example, employing an isotropic etch process. The second material of the first sacrificial material layers 142 and the fourth material of the second sacrificial material layers 242 may be removed in a same etch process, or can be removed in two separate etch processes. In case the fourth material is the same as the second material, the first sacrificial material layers 142 and the second sacrificial material layers 242 can be simultaneously removed by a same etch process through the backside contact trench 76.

Backside recesses 43 are formed in volumes from which the first sacrificial material layers 142 and the second sacrificial material layers 242 are removed. The removal of the second material of the first sacrificial material layers 142 and the fourth material of the second sacrificial material layers 242 can be selective to the first material of the first electrically insulating layers 132, the third material of the second electrically insulating layers 232, the material of the first dielectric material portion 165, the material of the second dielectric material portion 265, and the material of the source region 61. In one embodiment, the first sacrificial material layers 142 and the second sacrificial material layers 242 can include silicon nitride, and the materials of the first electrically insulating layers 132, the second electrically insulating layers 232, the first dielectric material portion 165, and the second dielectric material portion 265 can be selected from silicon oxide materials (such as doped silicate glass and undoped silicate glass) and dielectric metal oxides. In another embodiment, the first sacrificial material layers 142 and the second sacrificial material layers 242 can include a semiconductor material such as germanium or a silicon-germanium alloy, and the materials of the first electrically insulating layers 132, the second electrically insulating layers 232, the first dielectric material portion 165, and the second dielectric material portion 265 can be selected from silicon oxide, silicon nitride, and dielectric metal oxides.

The etch process that removes the second material and/or the fourth material selective to the first material and the third material can be a wet etch process employing a wet etch solution, or can be a gas phase (dry) etch process in which the etchant is introduced in a vapor phase into the backside contact trench 79. For example, if the first sacrificial material layers 142 and the second sacrificial material layers 242 include silicon nitride, the etch process can be a wet etch process in which the exemplary structure is immersed within a wet etch tank including phosphoric acid, which etches silicon nitride selective to silicon oxide, silicon, and various other materials employed in the art. The support pillar structures 155 provide structural support to the exemplary structure along with the first dielectric material portion 165 and the second dielectric material portion 265 while the backside recesses 43 are formed within volumes previously occupied by the first sacrificial material layers 142 or the second sacrificial material layers.

In one embodiment, each backside recess 43 can be a laterally extending cavity having a lateral dimension that is greater than the vertical extent of the cavity. In other words, the lateral dimension of each backside recess 43 can be greater than the height of the backside recess 43. A plurality of backside recesses 43 can be formed in the volumes from which the second material of the first sacrificial material layers 142 and the fourth material of the second sacrificial material layers 242 are removed. In one embodiment, the device region comprises an array of monolithic three-dimensional NAND strings having a plurality of device levels disposed above the substrate (9, 10). In this case, each backside recess 43 can define a space for receiving a respective word line of the array of monolithic three-dimensional NAND strings.

Each of the plurality of backside recesses 43 can extend substantially parallel to the top surface of the substrate (9, 10). A backside recess 43 can be vertically bounded by a top surface of an underlying electrically insulating layer (132 or 232) and a bottom surface of an overlying electrically insulating layer (132 or 232). In one embodiment, each backside recess 43 can have a uniform height throughout.

Referring to FIGS. 11A and 11B, a conductive material can be deposited in the plurality of backside recesses 43 and on sidewalls of the at least one backside contact trench 79. The conductive material can be deposited by a conformal deposition method, which can be, for example, chemical vapor deposition (CVD), atomic layer deposition (ALD), electroless plating, electroplating, or a combination thereof. The conductive material can be an elemental metal, an intermetallic alloy of at least two elemental metals, a conductive nitride of at least one elemental metal, a conductive metal oxide, a conductive doped semiconductor material, a conductive metal-semiconductor alloy such as a metal silicide, alloys thereof, and combinations or stacks thereof. Non-limiting exemplary conductive materials that can be deposited in the plurality of backside recesses 43 include tungsten, tungsten nitride, titanium, titanium nitride, tantalum, and tantalum nitride, ruthenium, cobalt, and combinations thereof. In one embodiment, the conductive material can comprise a metal such as tungsten and/or metal nitride. In one embodiment, the conductive material for filling the plurality of backside recesses 43 can be selected from tungsten and a combination of titanium nitride and tungsten. In one embodiment, the conductive material can be deposited by chemical vapor deposition. A plurality of first electrically conductive layers 146 is formed in the backside recesses 43 in the lower stack structure (132, 146, 190, 165), and a plurality of second electrically conductive layers 246 is formed in the backside recesses 43 in the upper stack structure (232, 242, 265) through the backside contact trench simultaneously during the same deposition step. The deposited conductive material does not completely fill the at least one backside contact trench 79. The deposited conductive material can be etched back from the sidewalls of each backside contact trench 79 above the upper stack structure (232, 246, 265). The first electrically conductive layer 146 and the second electrically conductive layers 246 are located outside the volume of the at least one backside contact cavity 79, and thus, are not etched. The first electrically conductive layers 146 and the second electrically conductive layers 246 can include control gate level electrically conductive layers, which function as a combination of a plurality of control gate electrodes and a word line electrically connecting, i.e., electrically shorting, the plurality of control gate electrodes. Each control gate level electrically conductive layer can be a word line that functions as a common control gate electrode for the plurality of vertical memory devices. In one embodiment, the first sacrificial material layers 142 and the second sacrificial material layers 242 can be simultaneously replaced with first electrically conductive layers 146 and second electrically conductive layers 246, respectively.

Referring to FIGS. 12A and 12B, an insulating spacer 74 and a backside contact via structure 76 (e.g., source line or electrode) can be formed within each backside contact trench 79 in contact with the source region 61. In one embodiment, a contiguous dielectric material layer can be deposited in each backside contact trench 79 and over the upper stack structure (232, 246, 265), and an anisotropic etch can be performed to remove horizontal portions of the contiguous dielectric material layer. Each remaining vertical portion of the contiguous dielectric material layer constitutes an insulating spacer 74. Each insulating spacer 74 includes a dielectric material, which can comprise, for example, silicon oxide, silicon nitride, a dielectric metal oxide, a dielectric metal oxynitride, or a combination thereof. The thickness of the insulating spacer 74 can be in a range from 1 nm to 50 nm, although lesser and greater thicknesses can also be employed.

Each cavity laterally surrounded by an insulating spacer 74 can be filled with a conductive material to form a backside contact via structure 76. Excess portions of the deposited dielectric material can be removed from above a horizontal plane including the top surface of the upper stack structure (232, 246, 265).

Figure 13A:
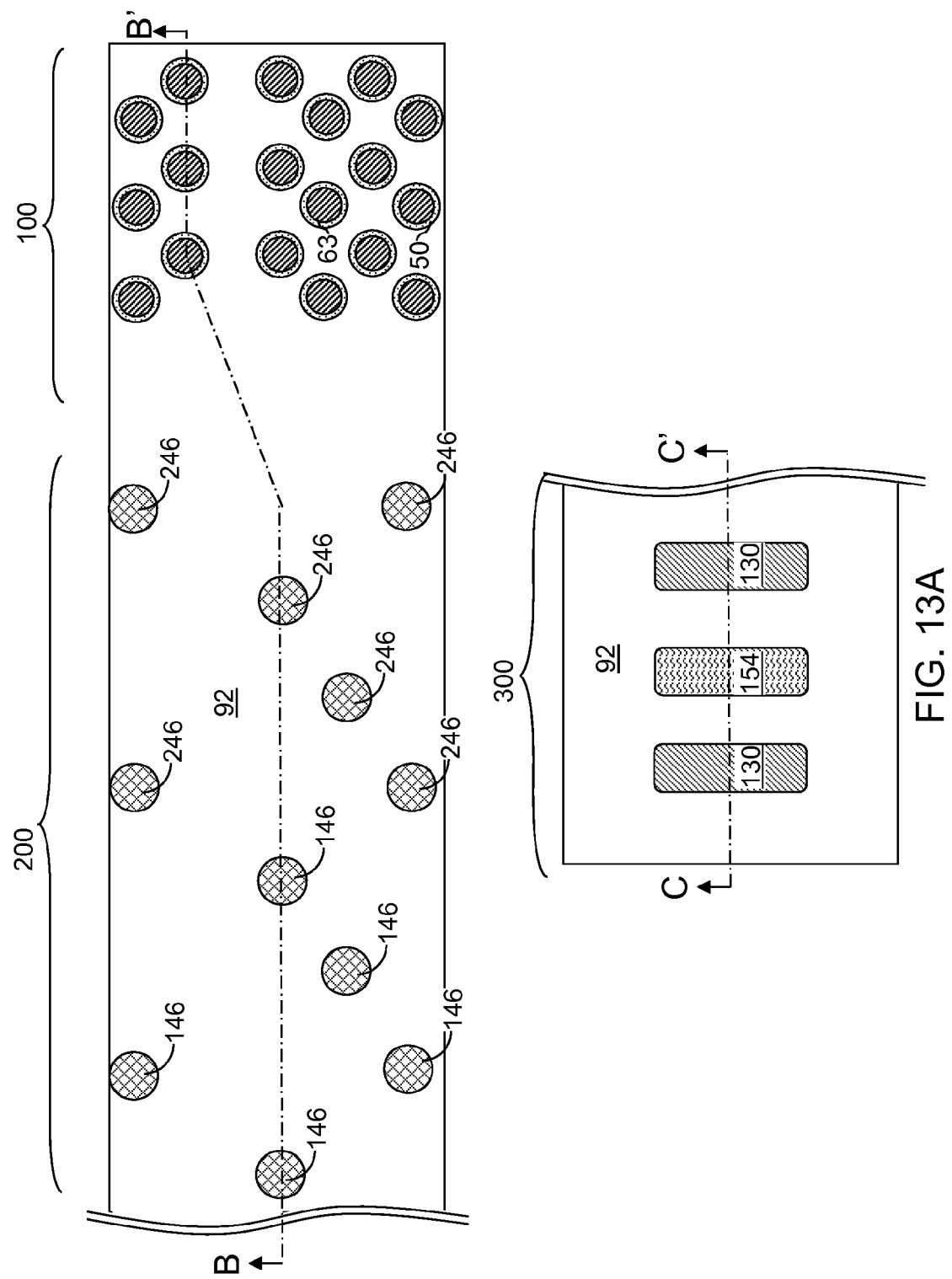
FIG. 13A is a top-down view of the exemplary structure after formation of various contact via cavities according to an embodiment of the present disclosure.
Figure 13B:
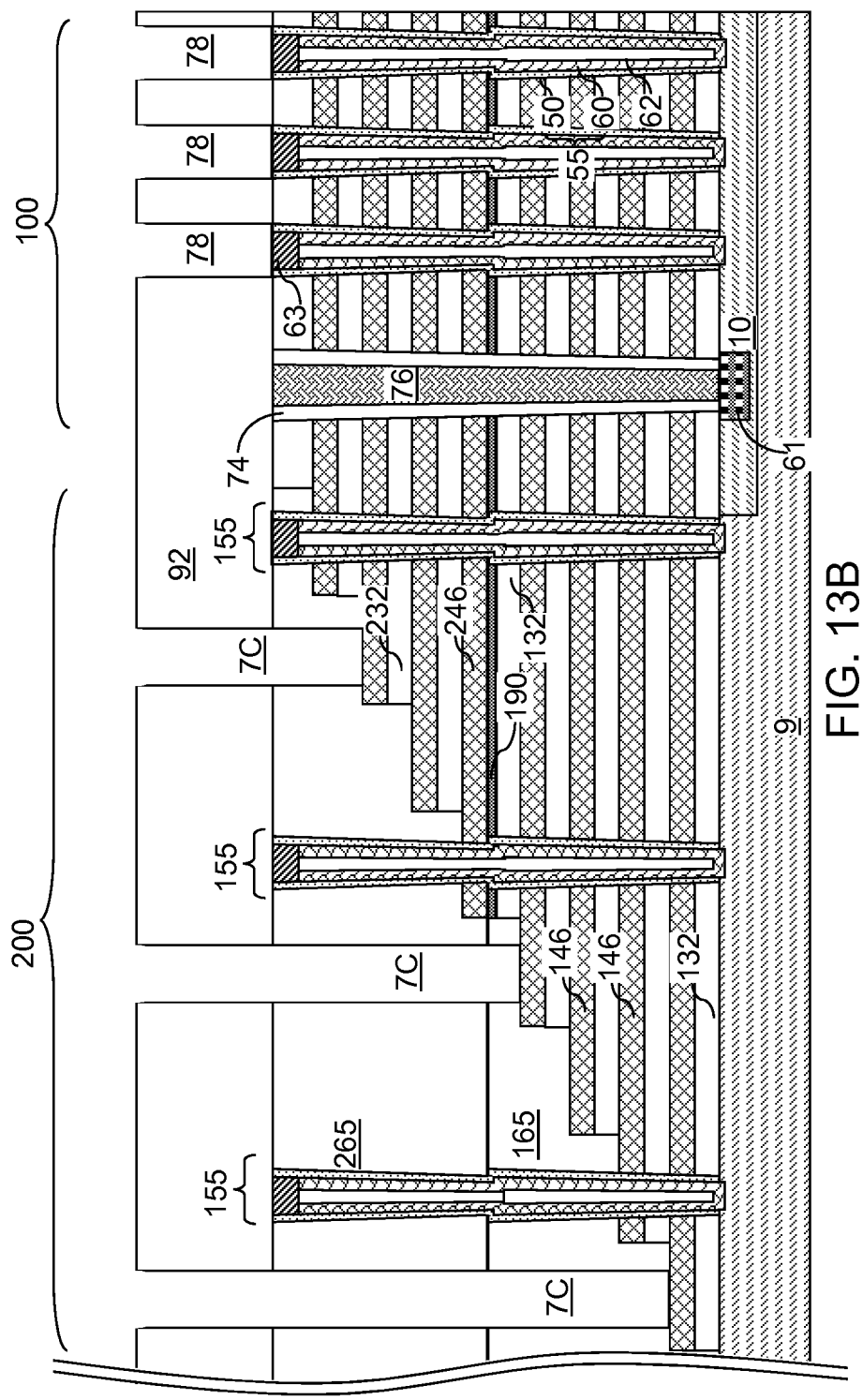
FIG. 13B is a vertical cross-sectional view of the exemplary structure of FIG. 13A along the vertical plane B-B'.
Figure 13C:
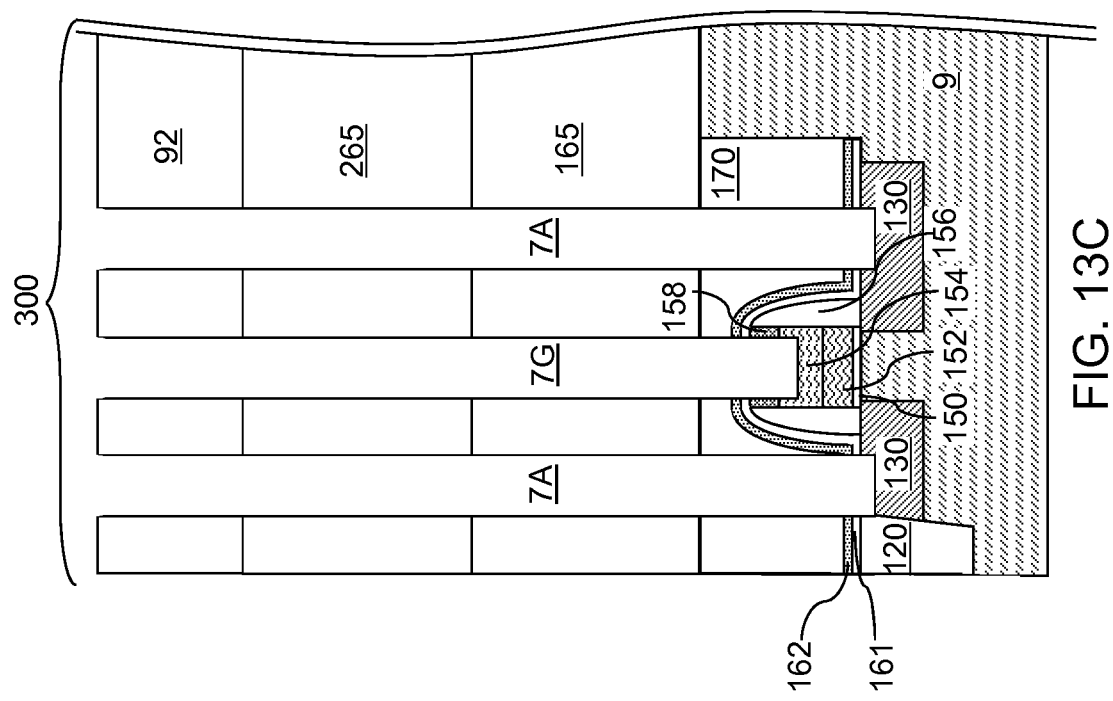
FIG. 13C is a vertical cross-sectional view of the exemplary structure of FIG. 13A along the vertical plane C-C'.

Referring to FIGS. 13A-13C, a contact level dielectric layer 92 can be formed over the upper stack structure (232, 246, 265). The contact level dielectric layer 92 can include at least one dielectric material selected from silicon oxide, silicon nitride, a dielectric metal oxide, organosilicate glass, or a combination thereof.

A photoresist layer is applied over the contact level dielectric layer 92 and lithographically patterned to form openings therein. The pattern in the photoresist layer can be transferred through the contact level dielectric layer 92, the second dielectric material portion 265, and the first dielectric material portion 165 to form various via cavities. The various via cavities can include control gate contact via cavities 7C extending from the top surface of the contact level dielectric layer 92 to a top surface of a respective electrically conductive layers (146, 246) within the stepped surface region 100, array contact via cavities 78 extending from the top surface of the contact level dielectric layer 92 to a top surface of respective drain regions 63 within the memory stack structures 55 in the device region 100, and peripheral via cavities (7A, 7G) that extend to electrical nodes of the peripheral devices in the peripheral device region 300. For example, the peripheral via cavities (7A, 7G) can include at least one active region contact via cavity 7A and at least one gate contact via cavity 7G. In one embodiment, all of the contact via cavities (7C, 78, 7A, 7G) can be formed employing a same etch step.

In one embodiment, the control gate contact via cavities 7C can include first via cavities extending through the contact level dielectric layer 92, the second material portion 265, and the first dielectric material portion 165, and can further include second via cavities extending through the contact level dielectric layer 92 and the second dielectric material portion 265 and not extending through the first dielectric material portion 165. The first and second via cavities 7C can be formed during the same etching step. The photoresist layer can be subsequently removed, for example, by ashing.

Since the via cavities 7C, 7A, 7G and 78 and the trench 79 are etched through the upper and lower stacks in one etching step, these via cavities and the trench do not have a notch in their sidewall (i.e., the notch 149, 159 is absent in the via cavities and the trench). Therefore, the cavities 7C, 7A, 7G and 78 and the trench 79 have a uniform decreasing taper along the axial direction from top to bottom.

Figure 14B:
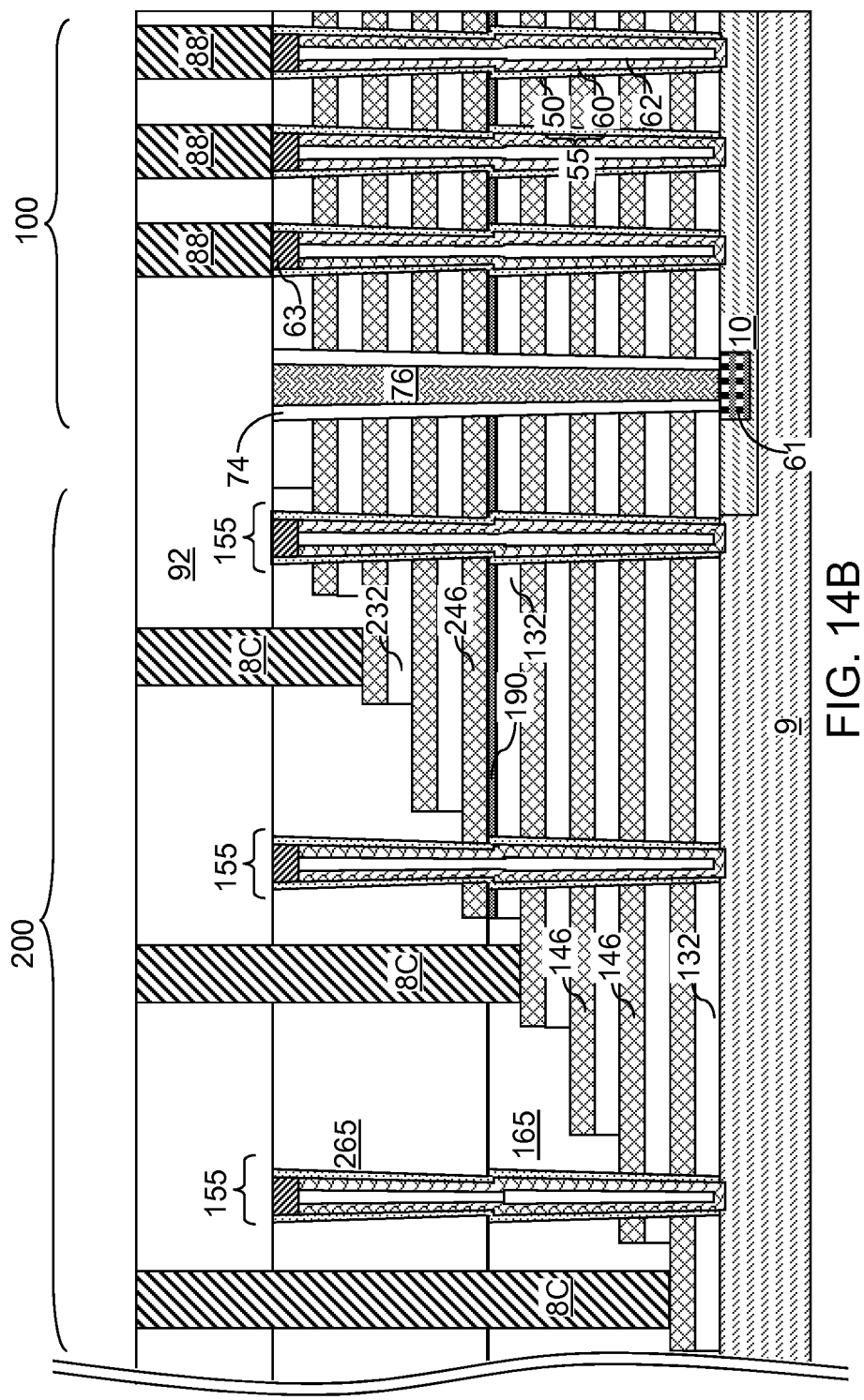
FIG. 14B is a vertical cross-sectional view of the exemplary structure of FIG. 14A along the vertical plane B-B'.
Figure 14C:
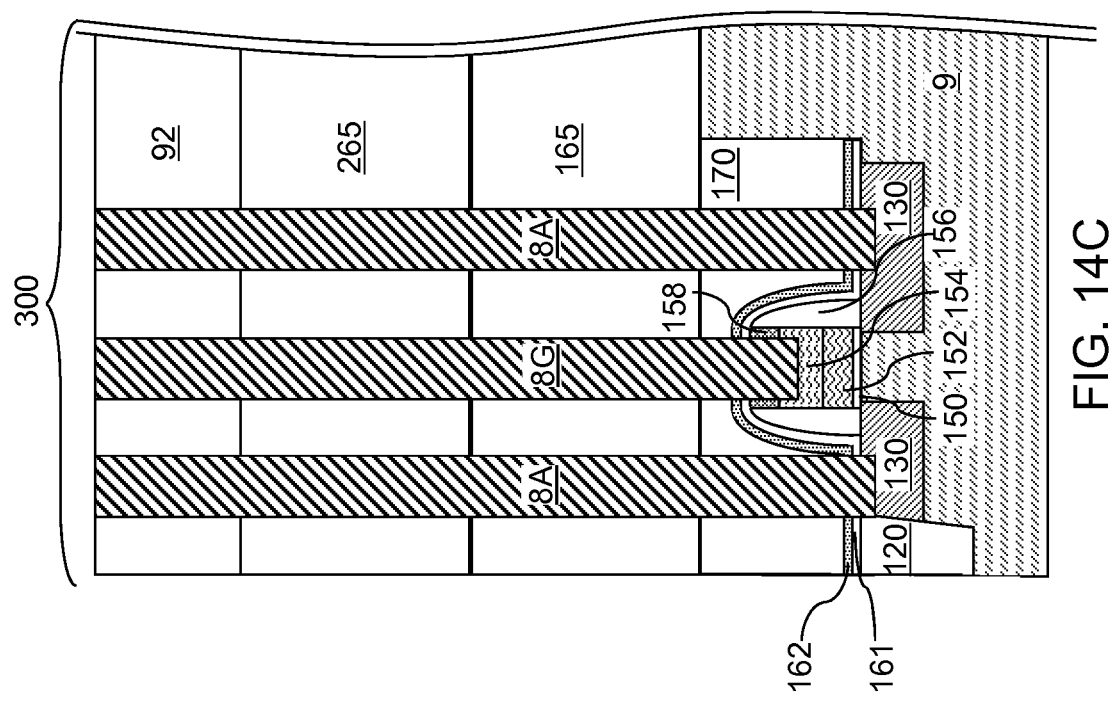
FIG. 14C is a vertical cross-sectional view of the exemplary structure of FIG. 14A along the vertical plane C-C'.

Referring to FIGS. 14A-14C, the various via cavities are filled with a conductive material to form various contact via structures (88, 8C, 8A, 8G), which can include, for example, drain contact via structures 88, and control gate contact via structures 8C. The various contact via structures (88, 8C. 8A, 8G) can be formed simultaneously by deposition of at least one conductive material and removal of the deposited conductive material(s) from above the top surface of the contact level dielectric layer 92. The various contact via structures (88, 8C. 8A, 8G) can include drain contact via structures 88 that contact a top surface of a respective drain region 63 within the memory stack structures 55, control gate contact via structures 8C that contact a top surface a respective electrically conductive layer (146, 246), and peripheral contact via structures (8A, 8G) that contact electrical nodes of the peripheral devices in the peripheral device region 300. For example, the peripheral contact via structures (8A, 8G) can include at least one active region contact via structure 8A and at least one gate contact via structure 8G. Additionally, a source-side contact via structure (not shown) can be formed on each backside contact via structure 76.

In one embodiment, the control gate contact via structures 8C can include first contact via structures extending through the contact level dielectric layer 92, the second material portion 265, and the first dielectric material portion 165, and contacting a top surface of a respective first electrically conductive layer 146. Further, the control gate contact via structures 8C can include second contact via structures extending through the contact level dielectric layer 92 and the second material portion 265, and contacting a top surface of a respective second electrically conductive layer 146. The first and second contact via structures 8C can be formed during the same deposition and planarization steps. In one embodiment, all of the various contact via structures (88, 8C. 8A, 8G) can be formed employing the same deposition step and the same planarization step.

No conductive structure is formed on the support pillar structures 155 during formation of the various contact via structures (88, 8C, 8A, 8G) or any subsequent processing steps that completes formation of the memory device of the present disclosure. Thus, the entire surfaces of the support pillar structure 155 contact dielectric materials or the semiconductor material of the substrate (9, 10). In other words, a surface of the substrate (9, 10) is the only surface that is not an insulator surface among the entire set of surfaces of the support pillar structures 155. The support pillar structures 155 are not removed during any processing step, and remain in the memory structure of the present disclosure after all processing steps are performed.

The exemplary structure can include a monolithic three-dimensional memory device that comprises: a lower stack structure (132, 146, 190, 165) comprising a first stack (132, 146) of alternating layers including first electrically insulating layers 132 and first electrically conductive layers 146 and located over a substrate (9, 10); an upper stack structure (232, 246, 265) comprising a second stack (232, 246) of alternating layers including second electrically insulating layers 232 and second electrically conductive layers 246 and located over the lower stack structure (132, 146, 165); and a plurality of memory stack structures 55 including respective vertical semiconductor channels 60. A bottommost portion of each vertical semiconductor channel 60 is electrically shorted to a source region 61 located within the substrate (9, 10), and a topmost portion of each vertical semiconductor channel 60 is electrically shorted to a drain contact via structure 88 overlying the vertical semiconductor channel 60. At least one support pillar structure 155 is located within a stepped surface region 200 of the lower and upper stack structures. Each support pillar structure 155 comprises a same set of materials as the plurality of memory stack structures 55. An entire top surface of each of the at least one support pillar structure 155 is in physical contact with a bottom surface of a dielectric material layer (e.g., the contact level dielectric layer 92) that overlies the at least one support pillar structure 155. In one embodiment, driver circuit contact via structures can be formed in the peripheral via cavities (7A, 7G) through the first dielectric material portion 165 and the second dielectric material portion 265 to driver circuit transistors.

In one embodiment, a plurality of contact via structures 88 can be formed on the memory stack structures, while not forming any conductive structure on, or in physical contact with, the at least one support pillar structure 155 after the three-dimensional memory device is completed. Thus, the three-dimensional memory device can be packaged without formation of any conductive structure on the at least one support pillar structure 155. In one embodiment, a respective drain contact via structure 88 contacts each respective drain region 63 in each memory stack structure 55, and no drain contact via or another conductive structure contacts the dummy drain region 63 in the at least one support pillar structure 155.

Each of the plurality of memory stack structures 55 comprises a memory film 50 including a memory material layer and a tunneling dielectric layer. In one embodiment, each of the at least one support pillar structure 155 comprises a dummy memory film 50 including a dummy memory material layer having the same composition as, and the same thickness as, the memory material layer. Each of the at least one support pillar structure 155 can comprise a dummy tunneling dielectric layer having the same composition as, and the same thickness as, the tunneling dielectric layer.

Each of the plurality of memory stack structures 55 comprises a semiconductor channel 60 including a semiconductor material. Each of the at least one support pillar structure 155 comprises a dummy semiconductor channel 60 having the same composition as, and the same thickness as, the semiconductor channel 60.

Each of the plurality of memory stack structures 55 comprises a drain region 63 contacting an upper portion of a respective semiconductor channel 60 and contacting a portion of a bottom surface of the dielectric material layer, i.e., the contact level dielectric material layer 92. Each of the at least one support pillar structure 55 comprises a dummy drain region 63 having the same composition as, and the same height as, the drain regions 63.

Each second electrically conductive layer 246 that underlies at least another second electrically conductive layer 246 laterally extends farther than any overlying layer among the second electrically conductive layers 246. Each first electrically conductive layer 146 that underlies at least another first electrically conductive layer 146 laterally extends father than any overlying layer among the first electrically conductive layers 146. Control gate contact via structures 8C are located within the stepped surface region 200, vertically extend at least through the second dielectric material portion 265 within the upper stack structure (232, 246, 265), and contact a respective electrically conductive layer selected from the first and second electrically conductive layers (146, 246). In one embodiment, the at least one support pillar structure 155 comprises a plurality of support pillar structures 155, and a nearest neighbor distance for the plurality of support pillar structures 155 is greater than a nearest neighbor distance among the plurality of memory stack structures 55.

In one embodiment, the lower stack structure (132, 146, 190, 165) comprises a first dielectric material portion 165 located on, and over, first stepped surfaces of the first stack (132, 146). The upper stack structure (232, 246, 265) comprises a second dielectric material portion 265 located on, and over, second stepped surfaces of the second stack (232, 246). The first stepped surfaces and the second stepped surfaces are located within the stepped surface region 200. A subset of control gate contact via structures 8C extends through the first dielectric material portion 165 and the second dielectric material portion 265.

In one embodiment, each vertical semiconductor channel 60 within the plurality of memory stack structures 55 contacts a first semiconductor material portion (such as the semiconductor material layer 10) having a doping of a first conductivity and located within the substrate (9, 10). Each support pillar structure 155 can contact a second semiconductor material portion (such as the substrate semiconductor layer 9) having a doping of a second conductivity type that is the opposite of the first conductivity type. The vertical semiconductor channels 60 can have a doping of the first conductivity type, or can be intrinsic.

In one embodiment, the monolithic three-dimensional memory structure comprises a monolithic three-dimensional NAND memory device, and the first and second electrically conductive layers (146, 246) comprise, or are electrically connected to, a respective word line of the monolithic three-dimensional NAND memory device. The substrate (9, 10) can comprise a silicon substrate. The monolithic three-dimensional NAND memory device can comprise an array of monolithic three-dimensional NAND strings over the silicon substrate. At least one memory cell in a first device level of the array of monolithic three-dimensional NAND strings can be located over another memory cell in a second device level of the array of monolithic three-dimensional NAND strings. The silicon substrate can contain an integrated circuit comprising a driver circuit for the memory device located thereon. The array of monolithic three-dimensional NAND strings can comprise a plurality of semiconductor channels 60. At least one end portion (such as a vertical semiconductor channel 60) of each of the plurality of semiconductor channels extends substantially perpendicular to a top surface of the substrate (9, 10). The array of monolithic three-dimensional NAND strings can comprise a plurality of charge storage elements (for example, in the memory film 50). Each charge storage element can be located adjacent to a respective one of the plurality of semiconductor channels. The array of monolithic three-dimensional NAND strings can comprise a plurality of control gate electrodes having a strip shape extending substantially parallel to the top surface of the substrate (9, 10). The plurality of control gate electrodes can comprise at least a first control gate electrode located in the first device level and a second control gate electrode located in the second device level.

Figure 15:
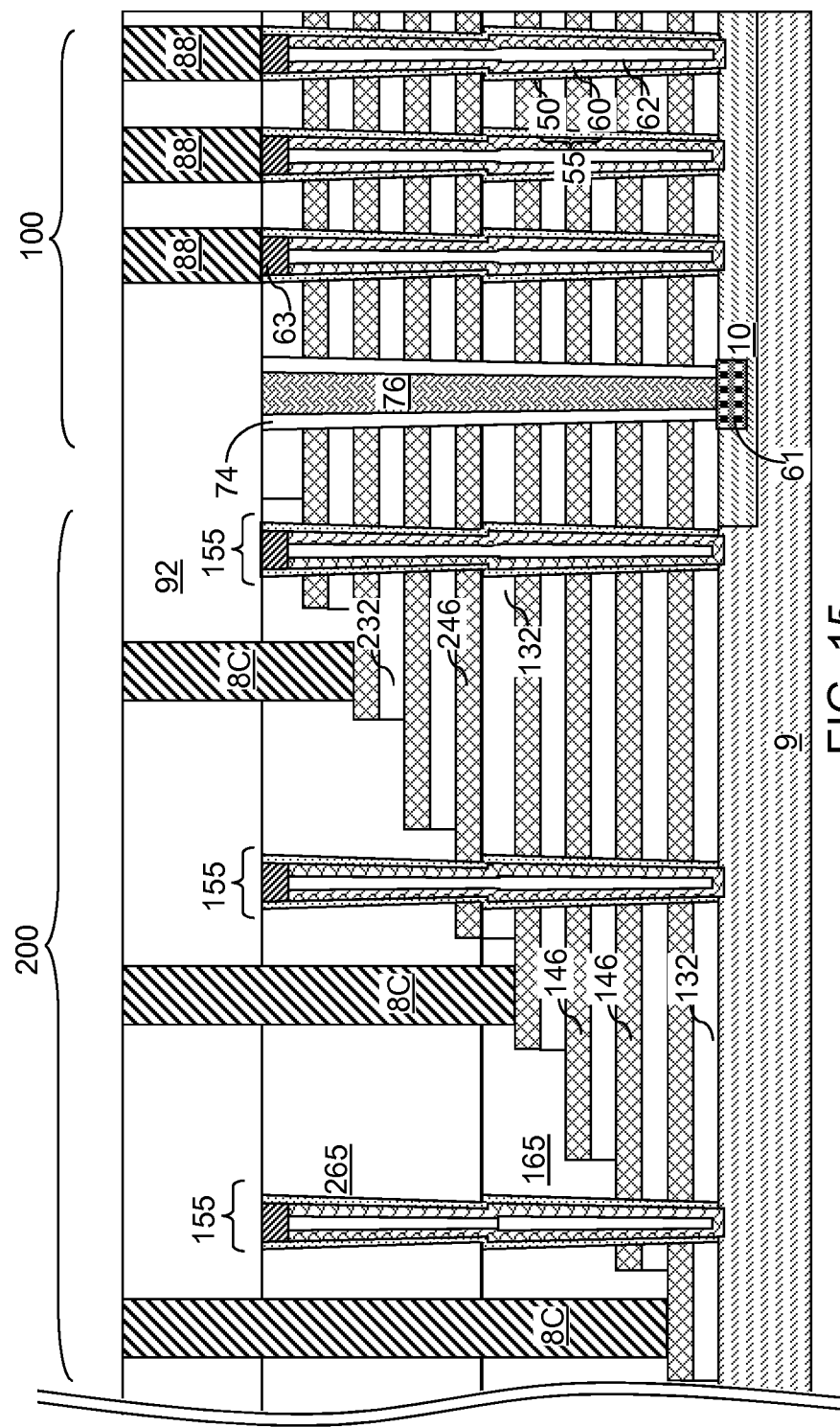
FIG. 15 is a vertical cross-sectional view of an alternative embodiment of the exemplary structure.

Referring to FIG. 15, an alternative embodiment of the exemplary structure is illustrated, which can be derived from the exemplary structure of FIGS. 14A-14C by omitting formation of the etch stop layer 190 at the processing steps of FIG. 1. In this case, the etch chemistries can be modified to stop on the topmost layer of the first stack (132, 142), which can be, for example, the topmost first electrically insulating layer 132. An overetch may occur into the topmost layer of the first stack (132, 142) during etch processes.

The present disclosure provides sequential stack etching, which alleviates the difficulties associated with etching a stack of material layers including many material layers. In other words, by dividing a large number of material layers to be etched into groups of smaller numbers of material layers, openings can be formed in a more efficient manner, and process complications arising from a high aspect ratio during formation of openings can be alleviated. For example, tapering of the bottommost portions of openings can be minimized employing the methods of the present disclosure. Further, because the horizontal cross-sectional areas of each inter-stack memory opening 49 and the inter-stack support opening 59 can have a neck (a region where the horizontal cross-sectional area becomes a local minimum) at the interface between the lower stack structure (132, 146, 190, 165) and the upper stack structure (232, 246, 265), the horizontal cross-sectional area of the memory stack structures 55 at the top portion of the upper stack structure (232, 246, 265) can be reduced relative to prior art structures in which each memory opening is formed through the entirety of a stack of alternating layers in a single anisotropic etch process.

Further, the support stack structures 155 can be formed without employing an additional processing step because each process step employed to form components of the support stack structures 155 is a step needed to form the memory stack structures 55. The support stack structures 155 provide structural support in regions where backside recesses 43 extend to significant lengths, and prevent collapse of components of the exemplary structure during processing.

Although the foregoing refers to particular preferred embodiments, it will be understood that the invention is not so limited. It will occur to those of ordinary skill in the art that various modifications may be made to the disclosed embodiments and that such modifications are intended to be within the scope of the invention. All of the publications, patent applications and patents cited herein are incorporated herein by reference in their entirety.

What is claimed is:
1. A monolithic three-dimensional memory device comprising:
a lower stack structure comprising a first stack of alternating layers including first electrically insulating layers and first electrically conductive layers and located over a substrate;
an upper stack structure comprising a second stack of alternating layers including second electrically insulating layers and second electrically conductive layers and located over the lower stack structure;
an etch stop dielectric layer located within the lower stack structure and overlying the first stack of alternating layers and contacting a bottom surface of the upper stack structure and comprising a dielectric material having a different composition than the first electrically insulating layers;
a plurality of memory stack structures including respective vertical semiconductor channels, wherein a bottommost portion of each vertical semiconductor channel is electrically shorted to a source region located below the lower stack, and an upper portion of each vertical semiconductor channel is electrically shorted to a drain contact via structure overlying the vertical semiconductor channel; and
at least one support pillar structure located within a stepped surface region of the lower and upper stack structures, comprising a same set of materials as the plurality of memory stack structures.

2. The monolithic three-dimensional memory device of claim 1, wherein:
an entire top surface of each of the at least one support pillar structure is in physical contact with a bottom surface of a dielectric material layer that overlies the at least one support pillar structure;
each of the plurality of memory stack structures comprises a memory film including a memory material layer and a tunneling dielectric layer.

3. The monolithic three-dimensional memory device of claim 2, wherein:
each of the at least one support pillar structure comprises a dummy semiconductor channel having a same composition as, and a same thickness as, the semiconductor channel; and
the dummy semiconductor channel is not electrically connected to a driver circuit of the monolithic three-dimensional memory device.

4. The monolithic three-dimensional memory device of claim 3, wherein:
each of the at least one support pillar structure comprises a dummy memory film including a dummy memory material layer having a same composition as, and a same thickness as, the memory film; and
each of the at least one support pillar structure comprises a dummy tunneling dielectric layer having a same composition as, and a same thickness as, the tunneling dielectric layer.

5. The monolithic three-dimensional memory device of claim 4, wherein:
no charge is stored in the dummy memory film during operation of the monolithic three-dimensional memory device;
no charge carriers tunnel through the dummy tunneling dielectric layer during operation of the monolithic three-dimensional memory device; and
no current flows through the dummy semiconductor channel during operation of the monolithic three-dimensional memory device.

6. The monolithic three-dimensional memory device of claim 4, wherein each of the plurality of memory stack structures comprises a drain region contacting an upper portion of a respective semiconductor channel and contacting a portion of a bottom surface of the dielectric material layer.

7. The monolithic three-dimensional memory device of claim 6, wherein:
- each of the at least one support pillar structure comprises a dummy drain region having a same composition as, and a same height as, the drain regions;
- a respective drain contact via structure contacts each respective drain region; and
- no drain contact via or another conductive structure contacts the dummy drain region.

8. The monolithic three-dimensional memory device of claim 1, wherein:
- each second electrically conductive layer that underlies at least another second electrically conductive layer laterally extends farther than any overlying layer among the second electrically conductive layers; and
- each first electrically conductive layer that underlies at least another first electrically conductive layer laterally extends farther than any overlying layer among the first electrically conductive layers.

9. The monolithic three-dimensional memory device of claim 8, further comprising control gate contact via structures located within the stepped surface region, vertically extending at least through a dielectric material portion within the upper stack structure, and contacting a respective electrically conductive layer selected from the first and second electrically conductive layers;
wherein:
- the at least one support pillar structure comprises a plurality of support pillar structures; and
- a nearest neighbor lateral distance for the plurality of support pillar structures is greater than a nearest neighbor distance among the plurality of memory stack structures.

10. The monolithic three-dimensional memory device of claim 1, further comprising a backside contact via structure located within a backside contact trench which extends through the lower and the upper stack structures;
wherein:
- the backside contact via structure is in contact with the source region;
- the plurality of memory stack structures are located in respective memory openings having a notch in their sidewall;
- the at least one support pillar structure is located in inter-stack support opening having a notch in its sidewall; and
- the backside contract trench does not have a notch in its sidewall.

11. The monolithic three-dimensional memory device of claim 1, wherein:
- the lower stack structure further comprises a first dielectric material portion located on, and over, first stepped surfaces of the first stack;
- the upper stack structure further comprises a second dielectric material portion located on, and over, second stepped surfaces of the second stack;
- the first stepped surfaces and the second stepped surfaces are located within the stepped surface region; and
- a subset of control gate contact via structures extends through the first dielectric material portion and the second dielectric material portion.

12. The monolithic three-dimensional memory device of claim 1, wherein:
- a bottommost portion of each vertical semiconductor channel is electrically shorted to the source region which is located within the substrate, and a topmost portion of each vertical semiconductor channel is electrically shorted to the drain contact via structure overlying the vertical semiconductor channel; and
- each vertical semiconductor channel within the plurality of memory stack structures contacts a first semiconductor material portion having a doping of a first conductivity and located within the substrate.

13. The monolithic three-dimensional memory device of claim 1, wherein:
- the monolithic three-dimensional memory structure comprises a monolithic three-dimensional NAND memory device;
- the first and second electrically conductive layers comprise, or are electrically connected to, a respective word line of the monolithic three-dimensional NAND memory device;
- the substrate comprises a silicon substrate;
- the monolithic three-dimensional NAND memory device comprises an array of monolithic three-dimensional NAND strings over the silicon substrate;
- at least one memory cell in a first device level of the array of monolithic three-dimensional NAND strings is located over another memory cell in a second device level of the array of monolithic three-dimensional NAND strings;
- the silicon substrate contains an integrated circuit comprising a driver circuit for the memory device located thereon; and
- the array of monolithic three-dimensional NAND strings comprises:
- a plurality of semiconductor channels, wherein at least one end portion of each of the plurality of semiconductor channels extends substantially perpendicular to a top surface of the substrate;
- a plurality of charge storage elements, each charge storage element located adjacent to a respective one of the plurality of semiconductor channels; and
- a plurality of control gate electrodes having a strip shape extending substantially parallel to the top surface of the substrate, the plurality of control gate electrodes comprise at least a first control gate electrode located in the first device level and a second control gate electrode located in the second device level.

14. The monolithic three-dimensional memory device of claim 1, wherein the etch stop dielectric layer comprises a dielectric metal oxide.

15. The monolithic three-dimensional memory device of claim 1, wherein the etch stop dielectric layer comprises a material selected from amorphous carbon, diamond-like carbon, and a carbon-containing dielectric material.

16. The monolithic three-dimensional memory device of claim 1, wherein a sidewall of the etch stop dielectric layer is vertically coincident with a topmost layer within the first stack of alternating layers.

17. The monolithic three-dimensional memory device of claim 1, wherein:
- the first stack of alternating layers includes first stepped surfaces;
- the second stack of alternating layer includes second stepped surfaces that are laterally offset from the first stepped surfaces;
- the lower stack structure further comprises a first retro-stepped dielectric material portion overlying the first stepped surfaces; and
- the upper stack structure further comprises a second retro-stepped dielectric material portion overlying the second stepped surfaces.

18. The monolithic three-dimensional memory device of claim 17, wherein a horizontal interface between the first and second retro-stepped dielectric material portions is located within a horizontal plane including a top surface of the etch stop dielectric layer.

19. The monolithic three-dimensional memory device of claim 1, wherein each of the at least one support pillar structure has a respective notch at an interface between the first stack of alternating layers and the second stack of alternating layers.

20. The monolithic three-dimensional memory device of claim 19, wherein each of the plurality of memory stack structures has a respective notch at the interface between the first stack of alternating layers and the second stack of alternating layers.

21. The monolithic three-dimensional memory device of claim 20, wherein:
the at least one support pillar structure comprises a plurality of support pillar structures;
a first support pillar structure that passes through the second stack of alternating layers pass through the etch stop dielectric layer; and
a second support pillar structure that does not pass through the second stack of alternating layers does not pass through the etch stop dielectric layer.

22. The monolithic three-dimensional memory device of claim 1, further comprising at least one peripheral device including a respective semiconductor channel located below a horizontal plane including a bottommost surface of the first stack of alternating layers.

23. The monolithic three-dimensional memory device of claim 1, further comprising at least one peripheral device including a respective semiconductor channel located below a horizontal plane including a topmost surface of the substrate.

24. The monolithic three-dimensional memory device of claim 23, wherein:
the topmost surface of the substrate is a horizontal semiconductor substrate of a substrate semiconductor layer; and
each semiconductor channel of the at least one peripheral device is located underneath a recessed horizontal surface of the substrate semiconductor layer.

25. The monolithic three-dimensional memory device of claim 24, further comprising:
a planarization dielectric layer located between the horizontal plane including the topmost surface of the substrate and the recessed horizontal surface of the substrate semiconductor layer;
a first retro-stepped dielectric material portion located within the lower stack structure and overlying the planarization dielectric layer;
a second retro-stepped dielectric material portion located within the upper stack structure and overlying the first retro-stepped dielectric material portion;
a peripheral contact via structure continuously extending through the first and second retro-stepped dielectric material portion and the planarization dielectric layer and contacting one of the at least one peripheral device; and
control gate contact structures extending at least through the second retro-stepped dielectric material portion and physically contacting a respective layer selected from the first and second electrically conductive layers and comprising a same conductive material as the peripheral contact via structure.

* * * * *